United States Patent [19]
Kimura et al.

[11] Patent Number: 5,876,819
[45] Date of Patent: Mar. 2, 1999

[54] CRYSTAL ORIENTATION DETECTABLE SEMICONDUCTOR SUBSTRATE, AND METHODS OF MANUFACTURING AND USING THE SAME

[75] Inventors: Yasuhiro Kimura; Keiji Yamauchi; Hidekazu Yamamoto; Shigehisa Yamamoto; Masafumi Katsumata; Yasukazu Mukogawa; Hajime Watanabe, all of Hyogo, Japan

[73] Assignee: Mitsubishi Denki Kabushiki Kaisha, Tokyo, Japan

[21] Appl. No.: 554,509

[22] Filed: Nov. 7, 1995

[30] Foreign Application Priority Data

Feb. 17, 1995 [JP] Japan ................................ 7-029378
Apr. 11, 1995 [JP] Japan ................................ 7-085719

[51] Int. Cl.$^6$ ................................................ B32B 3/02
[52] U.S. Cl. .................. 428/64.1; 428/66.5; 428/66.7; 257/797; 438/975
[58] Field of Search ................... 428/64.1, 66.5, 428/66.7; 257/797; 438/975

[56] References Cited

U.S. PATENT DOCUMENTS

| | | | |
|---|---|---|---|
| 3,558,899 | 1/1971 | Morgan et al. | 250/566 |
| 4,351,892 | 9/1982 | Davis | 430/30 |
| 4,534,804 | 8/1985 | Cade | 257/797 |
| 4,833,621 | 5/1989 | Umatate | 364/491 |
| 4,951,116 | 8/1990 | Kagawa | 257/797 |
| 5,314,837 | 5/1994 | Barber et al. | 438/504 |
| 5,340,435 | 8/1994 | Ito | 428/66.7 |

FOREIGN PATENT DOCUMENTS

| | | |
|---|---|---|
| 0126621 B1 | 11/1984 | European Pat. Off. . |
| 0230648 A2 | 8/1987 | European Pat. Off. . |
| 3530439 A1 | 2/1987 | Germany . |
| 61-290708 | 12/1986 | Japan . |
| 62-43142 | 2/1987 | Japan . |
| 1-50528 | 2/1989 | Japan . |
| 2-69925 | 3/1990 | Japan . |
| 2-218108 | 8/1990 | Japan . |
| 3-270120 | 12/1991 | Japan . |
| WO 92/02041 | 2/1992 | WIPO . |

OTHER PUBLICATIONS

"Photochemical vapor deposition of undoped and n–type amorphous silicon films produced from disilane," Appl. Phys. Lett. 43(8), 15 Oct. 1983, pp. 774–776.

"Ellipsometric End Point Detection During Plasma Etching," IEDM Technical Digest, pp. 12–15.

"Evaluating Technic for Semiconductor as Shown in 100 Examples," Akira USAMI, 1988, pp. 59–60, 53–55 and 109–112.

Stein et al., "Integral Measurement of Micron Lines on Wafers, Masks and Layers by Using Diffraction," IBM Technical Disclosure Bulletin, vol. 24, No. 7A, Dec. 1981, pp. 3178–3180.

Primary Examiner—Timothy M. Speer
Attorney, Agent, or Firm—McDermott, Will & Emery

[57] ABSTRACT

A semiconductor substrate with no reduction in the effective usage area and mechanical strength, and non-uniformity of the resist film thickness, and method of manufacturing and using the same are obtained. A detection mark for detecting the crystal orientation of a silicon wafer having an outer perimeter entirely of a circular contour is formed at a predetermined region of the silicon wafer. The crystal orientation of the semiconductor wafer can easily be detected with the outer perimeter still taking a circular contour. Therefore, various problems encountered in a conventional semiconductor substrate having an orientation flat or notch such as reduction in mechanical strength and effective usage area, and non-uniformity of the resist film can be circumvented.

9 Claims, 40 Drawing Sheets

CRYSTAL ORIENTATION DETECTABLE SEMICONDUCTOR SUBSTRATE, AND METHODS OF MANUFACTURING AND USING THE SAME

BACKGROUND OF THE INVENTION

1. Field of the Invention

The present invention relates to a semiconductor substrate, and methods of manufacturing and using the same. More particularly, the present invention relates to a semiconductor substrate that can have its crystal orientation detected, a method of manufacturing thereof, and a method of using such a semiconductor substrate.

2. Description of the Background Art

Most of the current semiconductor substrates are formed of silicon (Si). Particularly, a substrate formed of monocrystalline silicon is used from the standpoint of uniformity requirement of the semiconductor. To manufacture this monocrystalline silicon substrate, first a monocrystalline silicon ingot is formed according to a floating zone method (FZ method) by epitaxial growth using a seed crystal. This monocrystalline silicon ingot is cut and processed in a direction perpendicular to the growing axis thereof.

Since monocrystalline silicon has Si atoms arranged in order throughout the crystal, the crystal plane forming the surface of the substrate differs according to the direction of which it is cut. If the crystal plane is different, the nature of an oxide film ($SiO_2$) serving as an insulation film required for the functional aspect of the device formed on the substrate will not be uniform at a subsequent manufacturing step. This causes degradation in the reliability of the manufactured semiconductor device.

Conventionally, an orientation flat or notch is provided in the monocrystalline silicon substrate indicating a particular crystal orientation so that the crystal orientation of the monocrystalline silicon forming the substrate can easily be identified in forming a device on the substrate. Since a monocrystalline silicon ingot is manufactured according to epitaxial growth using a seed crystal as described above, a crystal is grown according to the crystal structure of the seed crystal in the growing axis, i.e., the direction of the cylinder axis of the ingot. It is therefore not necessary to identify the crystal orientation in the direction of the cylinder axis of the ingot. Identification of the crystal orientation in a plane perpendicular to the growing axis is carried out by identifying one direction on the plane perpendicular to the growing axis using the aforementioned orientation flat or notch.

FIG. 73 is a plan view showing a semiconductor substrate having a conventional orientation flat provided. Referring to FIG. 73, a conventional semiconductor substrate has an orientation flat 120 formed at a silicon wafer 101a for indicating the crystal orientation. FIGS. 74 to 78 are perspective views of a semiconductor substrate with the conventional orientation flat shown in FIG. 73 for describing the manufacturing process thereof. A method of manufacturing a semiconductor substrate with a conventional orientation flat will be described hereinafter with reference to FIGS. 74 to 78.

First, a monocrystalline silicon ingot 103a as shown in FIG. 74 is formed by a floating zone method (FZ method) or a Czochralski pulling method (CZ method). In these methods, a monocrystalline seed crystal 130 is dipped in a Si melted solution of high purity, whereby crystallization is advanced at the surface of the seed crystal. The Si atoms in the melted solution are arranged according to the arrangement of the atoms in the seed crystal and hardened, resulting in the so-called epitaxial growth. The entire ingot exhibits monocrystalline having an orderly arrangement of the atoms.

The pulled up monocrystalline silicon ingot 103a has both ends cut off. The ingot has the perimeter ground in diameter so that the cross section thereof is a true circle. Thus, a cylindrical monocrystalline silicon 103 as shown in FIG. 75 is provided.

The crystal orientation in the direction of the cylinder axis of cylindrical monocrystalline silicon 103 is known since it is determined depending upon seed crystal 130 used in forming the monocrystalline silicon ingot. However, the crystal orientation in the plane perpendicular to the cylinder axis is not identified. The crystal orientation of monocrystalline 103 is detected by an X-ray diffraction method as shown in FIG. 76.

According to the identified crystal orientation, a notch serving as an orientation flat is formed as shown in FIG. 77 in a direction indicating a predetermined crystal orientation. Cylindrical polycrystalline silicon 103 having a portion cut off is cut up into a predetermined thickness as shown in FIG. 78. Each portion is subjected to a grinding process to result in silicon wafer 101a. Thus, a semiconductor substrate with a conventional orientation flat was formed.

FIG. 79 is a plan view showing a semiconductor substrate with a conventional notch. Referring to FIG. 79, a conventional semiconductor substrate has a notch 119 indicating the crystal orientation formed in a silicon wafer 101b.

FIGS. 80 to 82 are perspective views of the semiconductor substrate having the conventional notch of FIG. 79 for describing the manufacturing process thereof. The process of manufacturing a semiconductor substrate with a conventional notch will be described hereinafter with reference to FIGS. 80 to 82. The step subsequent to the step shown in the aforementioned FIGS. 74 and 75 is shown in FIG. 80. In the step shown in FIG. 80, the crystal orientation of a monocrystalline silicon formed in a cylindrical configuration is identified by an X-ray diffraction method. According to the identified crystal orientation, a cut serving as a notch as shown in FIG. 81 is formed in a direction indicating a predetermined crystal orientation. Cylindrical monocrystalline silicon 103 having a portion cut off is cut up into a predetermined thickness as shown in FIG. 82. Each portion is subjected to a grinding step to result in silicon wafer 101. Thus, a semiconductor substrate having a conventional notch is formed.

Conventional semiconductor substrates with an orientation flat or a notch as shown in FIGS. 73 and 79 had the mark (orientation flat, notch) provided directly on the silicon wafer. Therefore, the area of the main surface of the silicon wafer is reduced by the portion of that mark. As a result, there was a problem that the effective usage area of the silicon wafer is reduced. There was also a problem in such conventional semiconductor substrates that the thickness of a resist film is increased at the portion of the mark in comparison with that of the other portions to cause non-uniformity in the thickness of the resist film. Furthermore, there was a problem that the mechanical strength is degraded due to stress concentration on the notch portion. There was also a disadvantage that foreign objects from the notch formation portion, which are particularly significant in the case of a semiconductor substrate with a notch, were generated.

SUMMARY OF THE INVENTION

An object of the present invention is to circumvent reduction in the mechanical strength and effective usage area, and non-uniformity of a resist film in a semiconductor substrate.

Another object of the present invention is to particularly prevent reduction in the mechanical strength in a semiconductor substrate.

A further object of the present invention is to readily manufacture a semiconductor substrate with no problem in reduction in the mechanical strength and effective usage area, and non-uniformity of a resist film in a method of manufacturing a semiconductor substrate.

Still another object of the present invention is to readily manufacture a semiconductor substrate that has no reduction particularly in the mechanical strength in a method of manufacturing semiconductor substrate.

Still a further object of the present invention is to easily identify the crystal orientation of an epitaxial layer in a method of using a semiconductor substrate.

Yet a further object of the present invention is to easily identify the crystal orientation of a semiconductor wafer having a mark formed thereat in a method of using a semiconductor substrate.

According to an aspect of the present invention, a semiconductor substrate includes a semiconductor wafer and a detection mark. The semiconductor wafer has an outer perimeter entirely of a circular contour. The mark is formed in a predetermined region at the surface of the semiconductor wafer to detect the crystal orientation of the semiconductor wafer. Preferably, the detection mark is formed in the proximity of the outer perimeter of semiconductor wafer.

Therefore, the crystal orientation of a semiconductor wafer can easily be detected while maintaining its former configuration of a circular semiconductor wafer with no characteristic configuration such as the conventionally used orientation flat. By forming the detection mark at the outer perimeter of the semiconductor wafer, the error generated in detecting the crystal orientation of a semiconductor wafer is significantly reduced in comparison with the case where a detection mark is formed at the center portion of a semiconductor wafer.

According to another aspect of the present invention, a semiconductor substrate includes first and second semiconductor wafers. The first semiconductor wafer has an outer perimeter entirely of a circular contour. The second semiconductor wafer is bonded to the first semiconductor wafer, and has a predetermined region of the surface thereof formed in a configuration that can detect the crystal orientation thereof.

Accordingly, the crystal orientation of the second semiconductor wafer can easily be detected while preventing reduction of the mechanical strength.

According to a further aspect of the present invention, a method of manufacturing a semiconductor substrate includes the steps of forming a monocrystalline semiconductor in a cylindrical shape, detecting the crystal orientation of the monocrystalline semiconductor, introducing impurities into a predetermined region of the monocrystalline semiconductor to form an impurity region indicating the crystal orientation, and processing the monocrystalline semiconductor to form a plurality of semiconductor wafers.

Accordingly, a semiconductor substrate is easily manufactured having an impurity region for detecting the crystal orientation of a semiconductor wafer formed in a predetermined region of the semiconductor wafer having an outer perimeter entirely of a circular contour.

According to still another aspect of the present invention, a method of manufacturing a semiconductor substrate includes the steps of forming a monocrystalline semiconductor in a cylindrical configuration, converting a predetermined region of the monocrystalline semiconductor into a different material by chemical reaction after detecting the crystal orientation of the monocrystalline semiconductor to form a region of a different material indicating the crystal orientation, and processing the semiconductor substrate to form a plurality of semiconductor wafers.

Accordingly, a semiconductor substrate can easily be manufactured having a region of a different material for detecting the crystal orientation of the semiconductor wafer formed in a predetermined region of the semiconductor wafer having an outer perimeter entirely of a circular contour.

According to yet a further aspect of the present invention, a method of manufacturing a semiconductor substrate includes the steps of processing a monocrystalline semiconductor in a cylindrical configuration, detecting the crystal orientation of the monocrystalline semiconductor to form a film for identifying the crystal orientation in a predetermined region on a surface of the outer perimeter side of the monocrystalline semiconductor, and processing the monocrystalline semiconductor to form a plurality of semiconductor wafers.

Accordingly, a semiconductor substrate is easily manufactured having a film for detecting the crystal orientation of a semiconductor wafer formed in a predetermined region of the semiconductor having an outer perimeter entirely of a circular contour.

According to yet another aspect of the present invention, a method of manufacturing a semiconductor substrate includes the steps of processing a monocrystalline semiconductor in a cylindrical configuration, detecting the crystal orientation of the monocrystalline semiconductor and then forming a first detection mark indicating the crystal orientation in a predetermined region at the outer perimeter of the monocrystalline semiconductor, processing the monocrystalline semiconductor to form a plurality of semiconductor wafers, and forming a second detection mark indicating the crystal orientation in a predetermined region at a main surface of the semiconductor wafer with the first detection mark as the reference.

Accordingly, a semiconductor substrate is easily manufactured having a detection mark of a predetermined surface configuration for detecting the crystal orientation of a semiconductor wafer in a predetermined region of the main surface in a semiconductor wafer having an outer perimeter entirely of a circular contour. The first detection mark may be formed of a member used for preventing damage of the semiconductor wafer in the step of forming the first detection mark in the monocrystalline semiconductor. As a result, a semiconductor substrate having a detection mark for identifying the crystal orientation can easily be manufactured while omitting the step of applying the first detection mark.

According to yet another aspect of the present invention, a method of manufacturing a semiconductor substrate includes the steps of forming a first semiconductor wafer having an outer perimeter entirely of a circular configuration, forming a second semiconductor wafer with the outer perimeter partially formed so as to detect the crystal orientation, and bonding the first and second semiconductor wafers together.

Accordingly, a semiconductor substrate can easily be manufactured that prevents reduction in the mechanical strength and that allows detection of the crystal orientation of the second semiconductor wafer.

According to yet a still further aspect of the present invention, a method of using a semiconductor substrate includes the steps of growing on a main surface of a semiconductor wafer an epitaxial layer having a step portion at the upper surface thereof corresponding to the crystal orientation, and identifying the crystal orientation of the epitaxial layer using the step portion thereof.

Accordingly, the crystal orientation of an epitaxial layer can easily be identified requiring no particular steps in a semiconductor substrate where an epitaxial layer has to be grown.

According to yet another aspect of the present invention, a method of using a semiconductor substrate includes the steps of growing on a main surface of a semiconductor wafer an epitaxial layer with a concave and convex at the upper surface thereof of a configuration corresponding to the main orientation, and detecting the concave and convex configuration to identify the crystal orientation of the epitaxial layer.

Accordingly, the crystal orientation of the epitaxial layer is easily identified with no particular steps required in a semiconductor substrate where an epitaxial layer has to be grown.

According to yet a still further aspect of the present invention, a method of using a semiconductor substrate includes the steps of differentiating the physical nature of a semiconductor wafer portion where a detection mark is formed from that of the other portion of the semiconductor wafer, and detecting the position of the detection mark utilizing the difference in the physical characteristic to identify the crystal orientation of the semiconductor wafer.

Accordingly, the crystal orientation of the semiconductor wafer can easily be identified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

Figure 1:
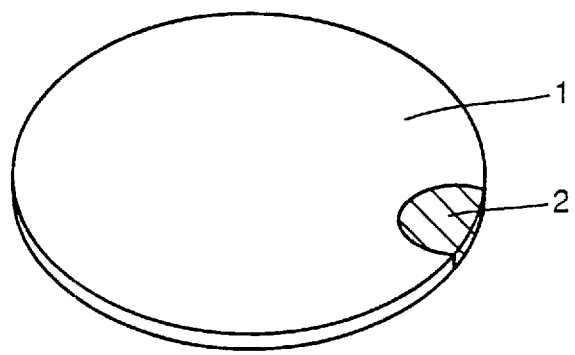
FIG. 1 is a perspective view showing a semiconductor substrate according to a first embodiment of the present invention.

Referring to FIG. 1 of a semiconductor substrate according to a first embodiment, an impurity region 2 for detecting the crystal orientation of a silicon wafer 1 is formed at the outer periphery portion of silicon wafer 1. Phosphorus, boron, arsenic, antimony and oxygen can be enumerated as impurities included in impurity region 2.

Figure 73:
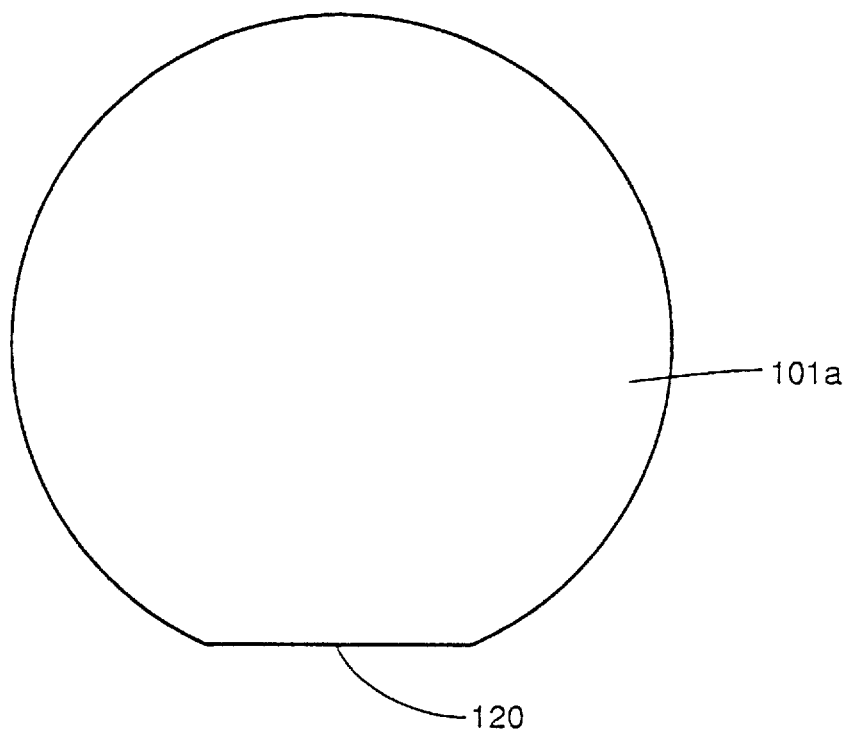
FIG. 73 is a plan view showing a semiconductor substrate having a conventional orientation flat.
Figure 74:
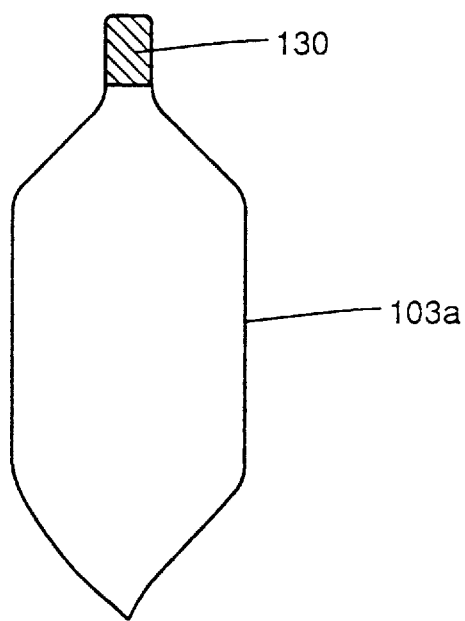
FIGS. 74–78 are perspective views of a semiconductor substrate with the conventional orientation flat shown in FIG. 73 for describing first to fifth steps of a manufacturing process thereof.
Figure 75:
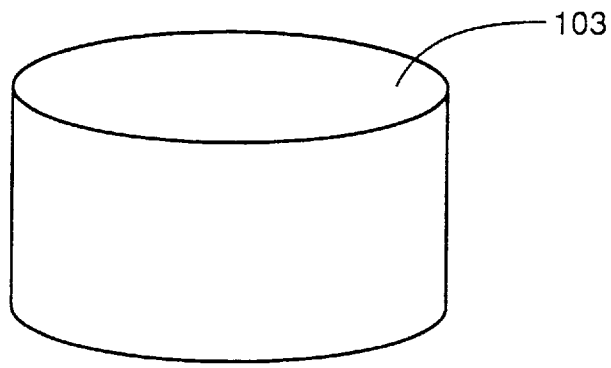
Figure 76:
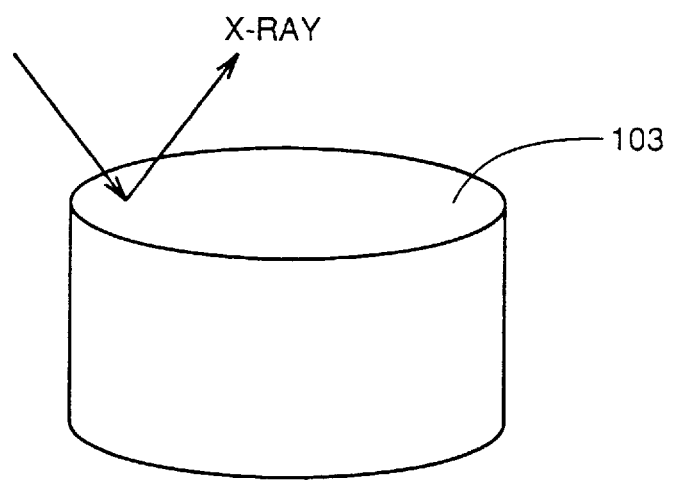
Figure 77:
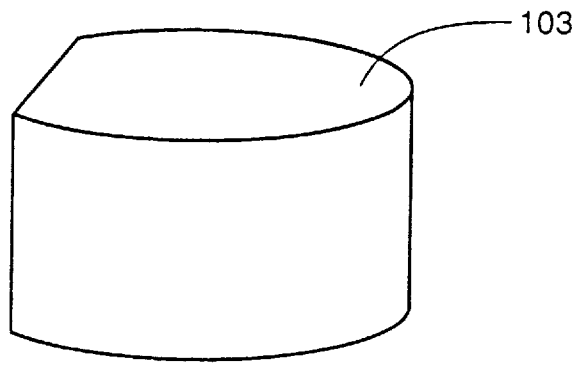
Figure 78:
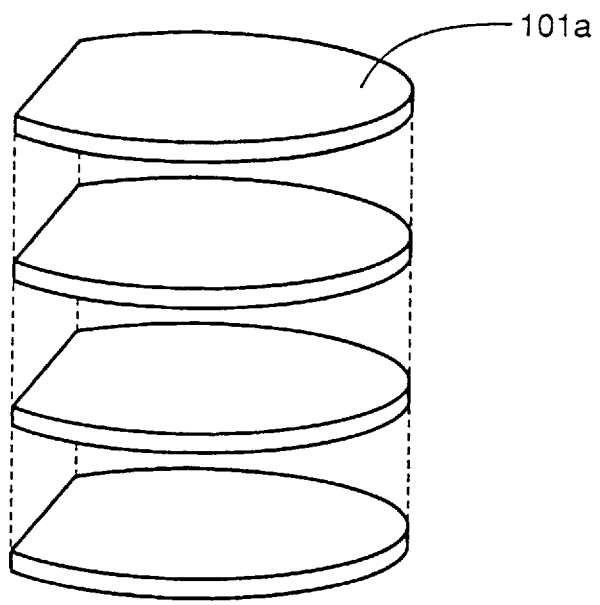
Figure 79:
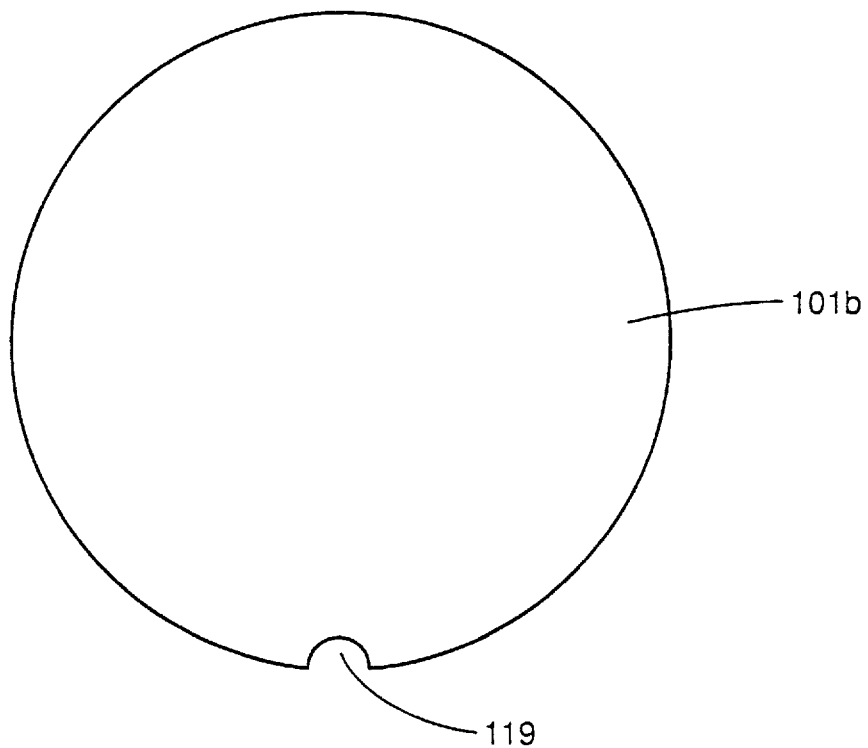
FIG. 79 is a plan view showing a semiconductor substrate with a conventional notch.
Figure 80:
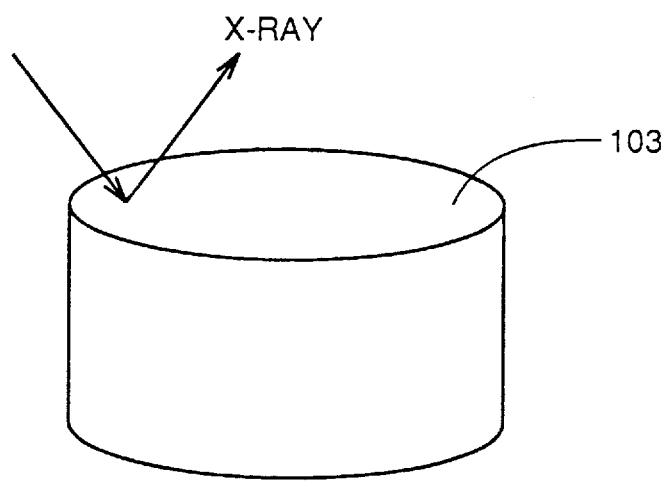
FIGS. 80–82 are perspective views of the semiconductor substrate with the conventional notch shown in FIG. 79 for describing first to third steps of the manufacturing process thereof.
Figure 81:
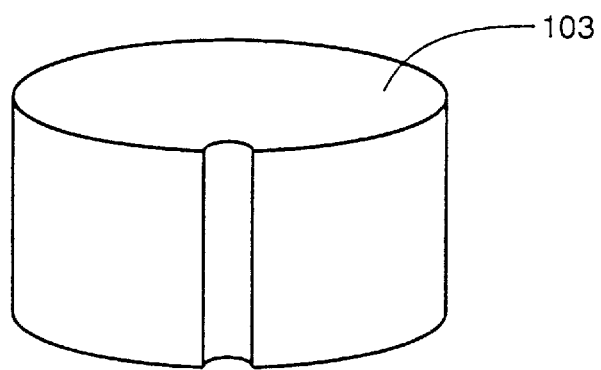
Figure 82:
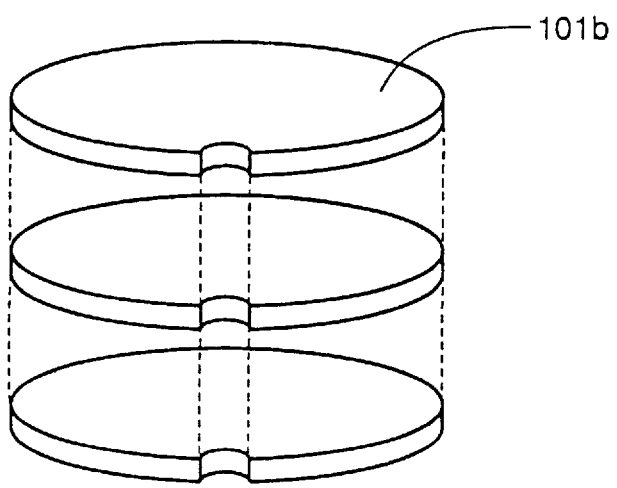

In contrast to the conventional semiconductor wafers having an orientation flat or a notch applied shown in FIGS. 73 and 79, the wafer of the first embodiment has a complete circular contour to prevent generation of various problems encountered in conventional products such as reduction in the effective area and mechanical strength, non-uniformity in the resist and generation of foreign objects.

Figure 2:
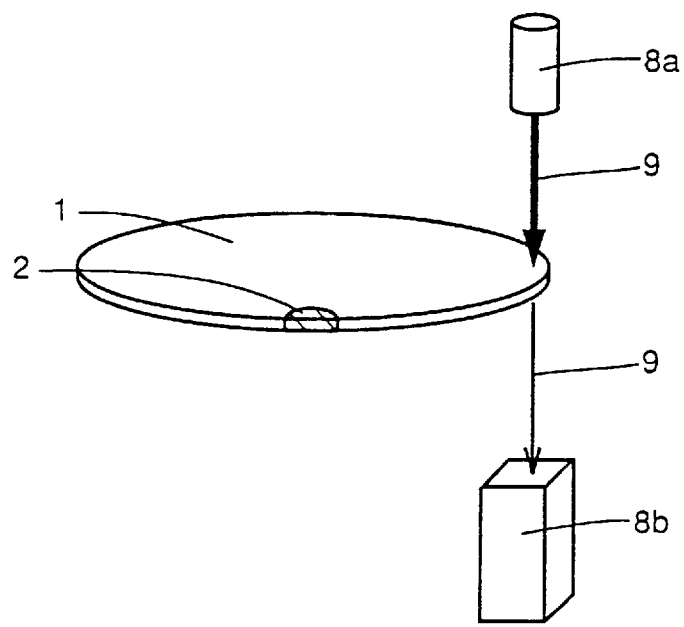
FIGS. 2 and 3 are concept diagrams for describing a method of using a semiconductor substrate according to the first embodiment shown in FIG. 1.

Referring to FIG. 2, a method of using the semiconductor substrate of the first embodiment will be described. In this usage method, the absorbed amount of an infrared ray 9 passing through silicon wafer 1 is measured by a combination of an infrared generator 8a and an infrared detector 8b. The outer perimeter portion of silicon wafer 1 is scanned to measure the absorbed amount of infrared ray in respective positions of the perimeter portion. Since impurity region 2 has the infrared ray absorbed due to the included impurities, the absorbed amount of infrared ray in impurity region 2 is greater than that of other portions. For example, when an infrared ray of a wavelength of at least 10000 Å is used, the absorption coefficient is at least 0.4 when the resistivity of the impurity region is not more than 0.5 Ωcm. By detecting a point where the absorbed amount of infrared ray is great, the position of impurity region 2 can be located. Therefore, the crystal orientation of silicon wafer 1 can easily be identified. Identification of the crystal orientation may be carried out by an arbitrary step.

Figure 3:
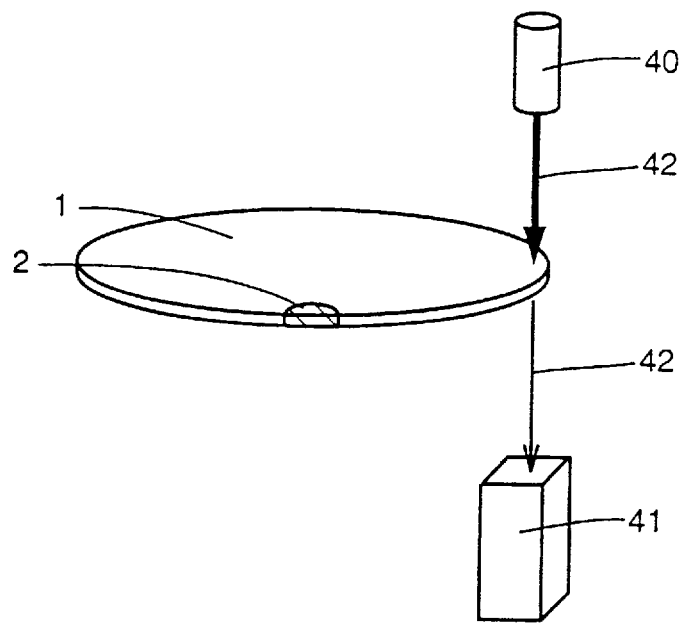

FIG. 3 is a diagram for describing another method of usage of the semiconductor substrate of the first embodiment. Referring to FIG. 3, this another method can be applied to a silicon wafer 1 having a region 2 including impurities of a type different from that of those included in silicon wafer 1. The outer perimeter portion of silicon wafer 1 is scanned using an optical pulse 42 generated from a non-contact PN determinator 40. Photoelectromotive force generated by scanning silicon wafer 1 with optical pulse 42 is detected by a non-contact detector 41 taking advantage of electrostatic coupling. According to difference in the conductivity type of the impurities in silicon substrate 1, the polarity of the generated photoelectromotive force differs. Therefore, the polarity of the photoelectromotive force generated in region 2 including impurities differs from that of the other portion of silicon wafer 1. The position of the region 2 including impurities is located by detecting this difference by detector 41. The crystal orientation can be identified on the basis of detection of the position of the region including impurities. Detection of the crystal orientation can be carried out by an arbitrary step.

Referring to FIGS. 4 to 7, a first manufacturing process of the semiconductor substrate of the first embodiment will be described hereinafter.

Figure 4:
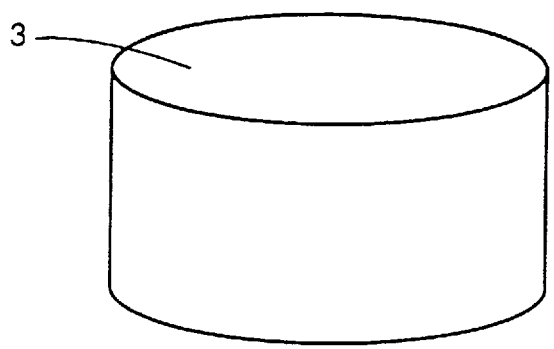
FIGS. 4–7 are perspective views of the semiconductor substrate of the first embodiment shown in FIG. 1 for describing first to fourth steps of a first manufacturing process thereof.
Figure 5:
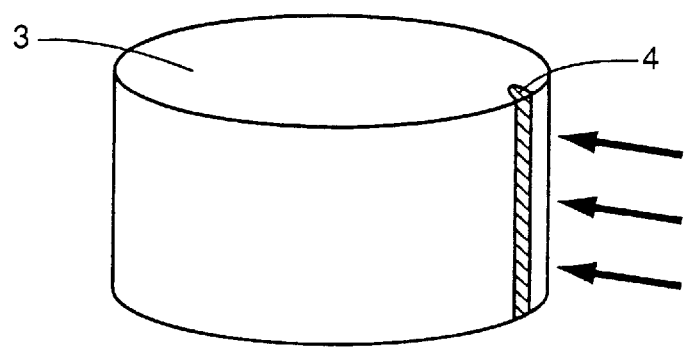

Similar to the conventional case, a monocrystalline silicon ingot manufactured by a floating zone method (FZ method) or a Czochralski pulling method (CZ method) as shown in FIG. 4 is processed to form cylindrical monocrystalline silicon 3. The crystal orientation of cylindrical monocrystalline silicon 3 is identified by an X-ray diffraction method. Then, impurities are implanted into the outer perimeter portion corresponding to the crystal orientation by ion implantation in a slit manner parallel to the cylinder axis. Phosphorus, boron, arsenic, antimony, or oxygen is used as the impurity. For example, impurities are implanted using boron at an implantation energy of 500 KeV at the amount of at least $1 \times 10^{15}$ atoms/cm$^3$.

Figure 6:
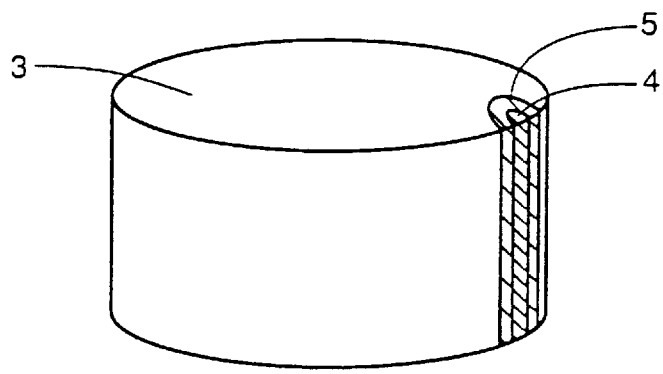
Figure 7:
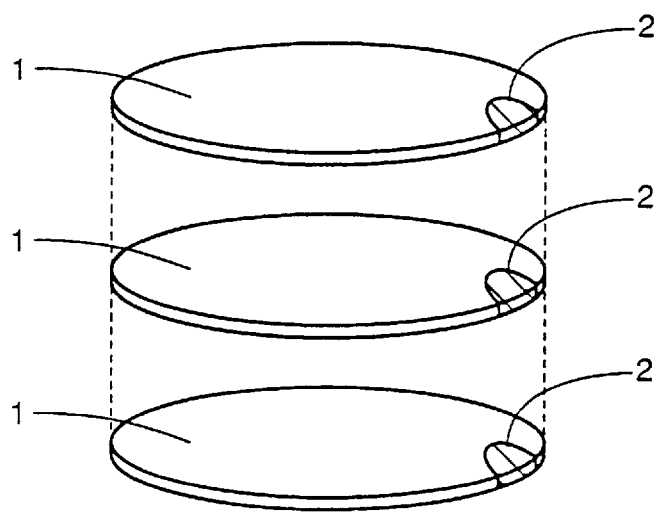

Then, as shown in FIG. 6, the implanted impurities are diffused into monocrystalline silicon 3 by thermal treatment to form an impurity diffusion region 5. Such diffusion of impurities causes the spread of impurities to facilitate subsequent detection of the impurity region. Then, cylinder monocrystalline silicon 3 with an impurity diffusion region 5 is cut up into a predetermined thickness as shown in FIG. 7 similar to the conventional case. Then, a grinding step is applied to result in silicon wafer 1. Thus, a semiconductor substrate of the first embodiment is completed having an impurity region formed at the surface of a circular silicon wafer 1.

Figure 8:
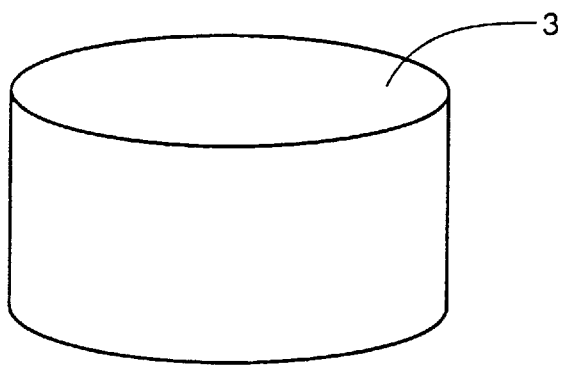
FIGS. 8–11 are perspective views of the semiconductor substrate of the first embodiment shown in FIG. 1 for describing first to fourth steps of a second manufacturing process thereof.
Figure 9:
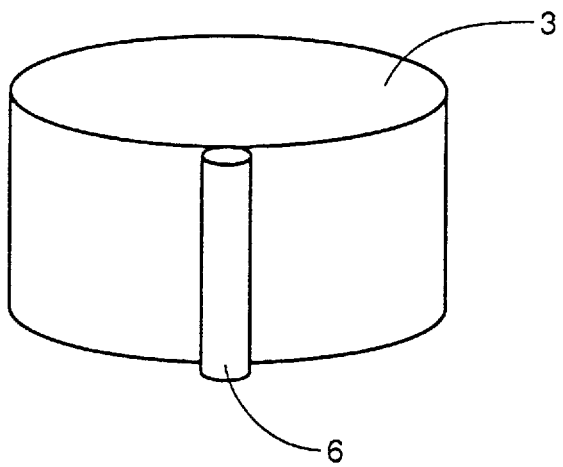

A second manufacturing process of the semiconductor substrate of the first embodiment will be described hereinafter with reference to FIGS. 8 to 11. Similar to the conventional case, a monocrystalline silicon ingot formed by a FZ method or a CZ method as shown in FIG. 8 is processed to result in cylindrical monocrystalline silicon 3.

Figure 10:
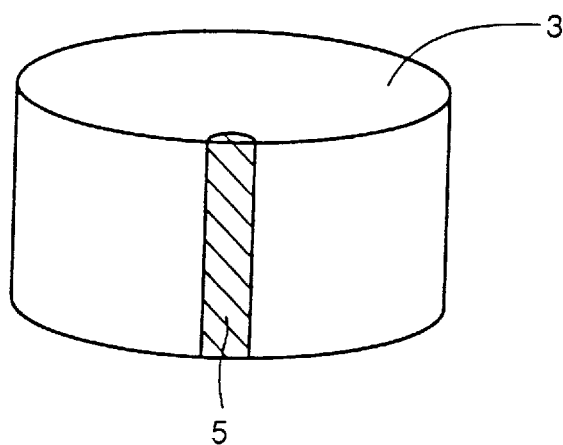

The crystal orientation of cylindrical monocrystalline silicon 3 is identified by an X-ray diffraction method. Then, a silicon rod 6 including impurities is brought into contact with the outer perimeter corresponding to the crystal orientation parallel to the cylinder axis. The impurities in silicon rod 6 are diffused into monocrystalline silicon 3 by thermal treatment to form an impurity diffusion region 5 in which impurities are diffused as shown in FIG. 10. Phosphorus, boron, arsenic, antimony or oxygen are enumerated as impurities to be used. In addition to silicon rod 6 including such impurities as a semiconductor rod, a silicon dioxide rod may be used.

Figure 11:
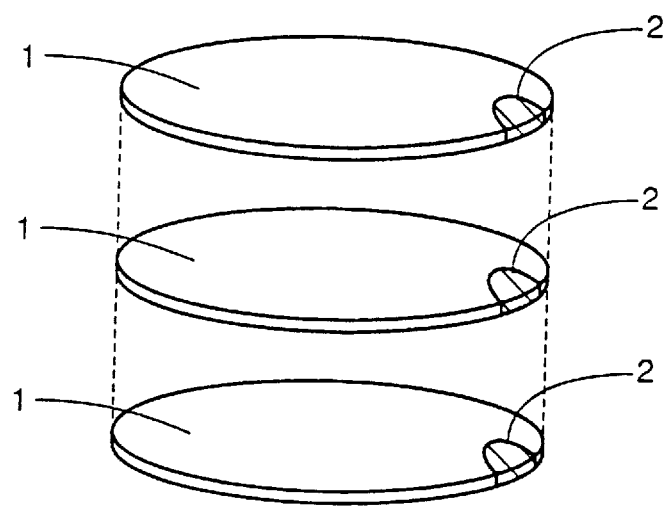

Referring to FIG. 11, cylindrical monocrystalline silicon 3 having impurity diffusion region 5 is cut up to a predetermined thickness as shown in FIG. 11, and subjected to a grinding step to result in silicon wafer 1. Thus, a semiconductor substrate of the first embodiment is completed having an impurity region formed at the surface of a circular silicon wafer 1.

A third manufacturing process of the semiconductor substrate of the first embodiment will be described hereinafter with reference to FIGS. 12 to 15.

Figure 12:
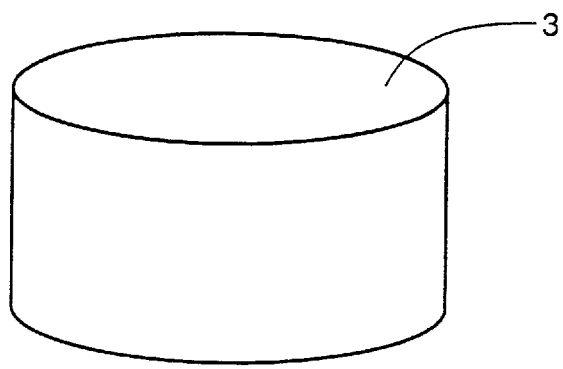
FIGS. 12–15 are perspective views of the semiconductor substrate of the first embodiment shown in FIG. 1 for describing first to fourth manufacturing steps of a third manufacturing process thereof.
Figure 13:
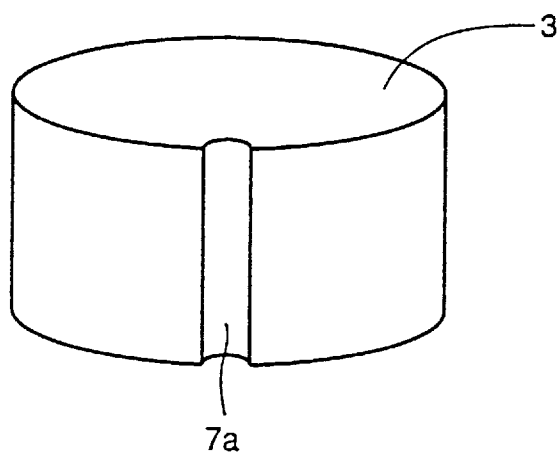

As shown in FIG. 12, the monocrystalline silicon ingot formed by the FZ method or CZ method is processed to form a cylindrical monocrystalline silicon 3. After identifying the crystal orientation of cylindrical monocrystalline silicon 3 by X-ray diffraction, a groove 7a is formed at the outer perimeter corresponding to the crystal orientation as shown in FIG. 13 in parallel to the cylinder axis.

Figure 14:
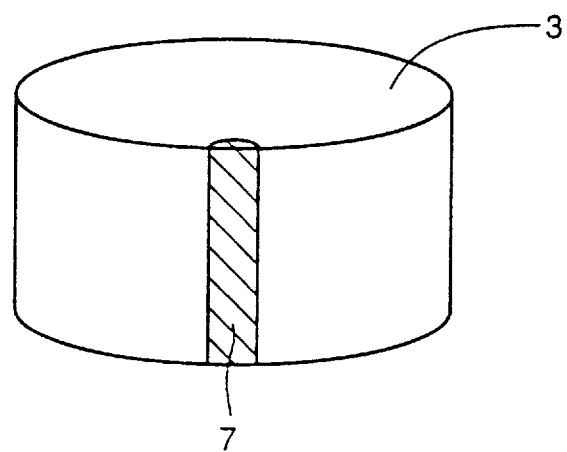
Figure 15:
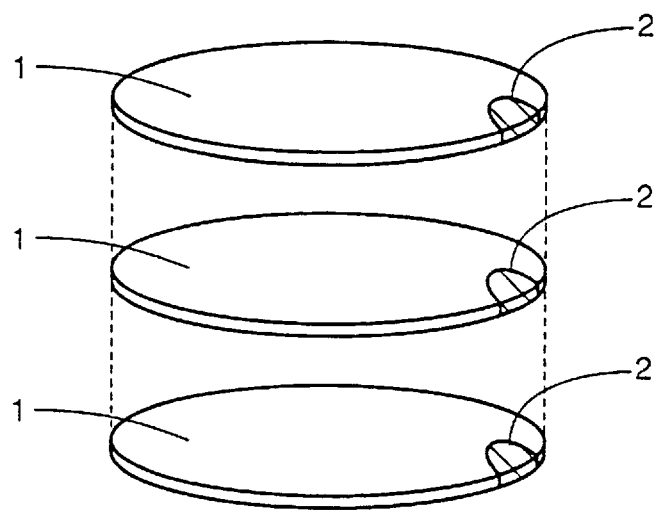

Then, as shown in FIG. 14, a silicon melted solution including impurities is poured into groove 7a and hardened to result in impurity region 7. Then, as shown in FIG. 15, cylindrical monocrystalline silicon 3 is cut up into a predetermined thickness and then subjected to a grinding step to result in silicon wafer 1. Thus, a semiconductor substrate of the first embodiment is completed having a structure in which an impurity region is formed at the main surface of circular silicon wafer 1.

Figure 16:
FIG. 16 is a perspective view showing a semiconductor substrate according to a second embodiment of the present invention.
Figure 17:
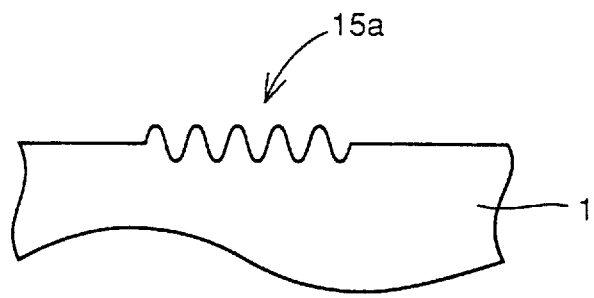
FIGS. 17 and 18 are enlarged sectional views of region A shown in FIG. 16.
Figure 18:
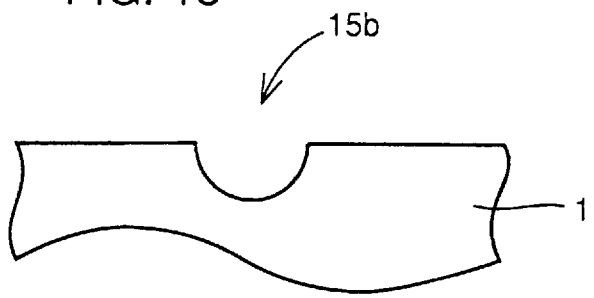

Referring to FIG. 16, a semiconductor substrate according to a second embodiment has a detectable mark 15 for identifying the crystal orientation of silicon wafer 1 formed at the outer perimeter portion of silicon wafer 1. Mark 15 (15a, 15b) forms a part of the surface of silicon wafer 1, and has a predetermined surface configuration as shown in FIG. 17 or FIG. 18. Similar to the above-described first embodiment, the second embodiment has a complete circular outer perimeter of silicon wafer 1 in contrast to a conventional semiconductor substrate shown in FIGS. 73 and 79 including an orientation flat or a notch. Therefore, problems encountered in conventional products such as reduction in the effective area and mechanical strength, non-uniformity of a resist, and generation of foreign objects do not occur.

Referring to FIGS. 19 to 23, a first manufacturing process of the semiconductor substrate of second embodiment will be described hereinafter.

Figure 20:
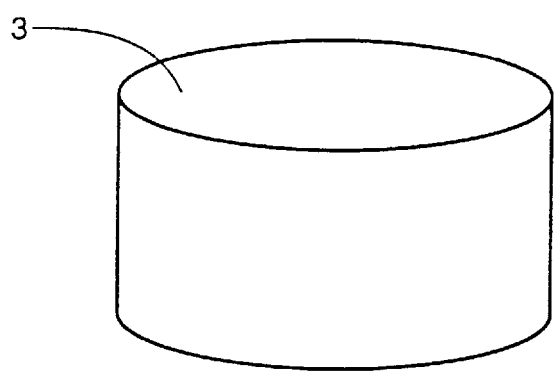
FIGS. 20–23 are perspective views of the semiconductor substrate according to the second embodiment shown in FIG. 16 for describing first to fourth steps of the first manufacturing process thereof.
Figure 21:
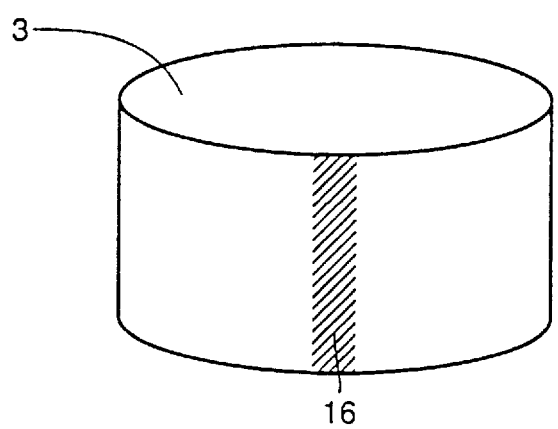
Figure 22:
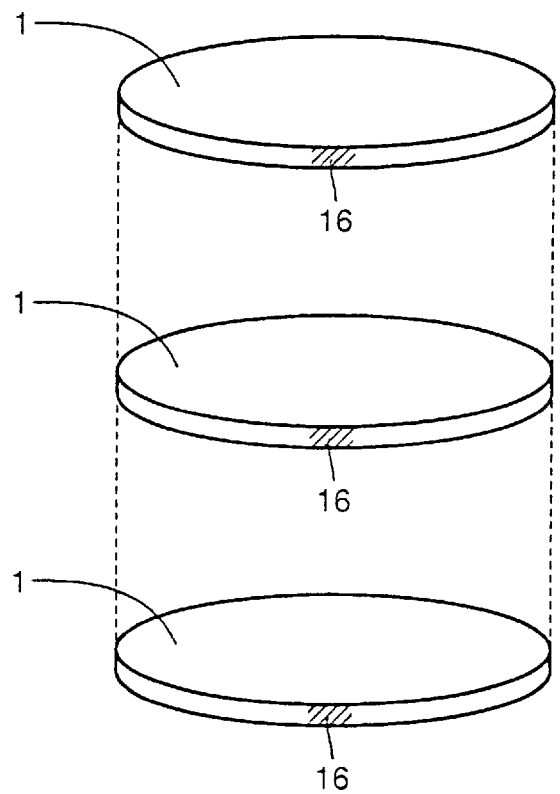

As shown in FIG. 20, a monocrystalline silicon ingot formed by FZ method or CZ method is processed to result in cylindrical monocrystalline silicon 3. After detecting the crystal orientation of cylindrical monocrystalline silicon 3 by an X-ray diffraction method, a detectable mark of a coating material such as ink, paint, magnetic powder, or the like is applied at the outer perimeter portion of the cylinder corresponding to the crystal orientation, and in parallel to the cylinder axis as shown in FIG. 21. Cylindrical monocrystalline silicon 3 to which a mark is applied is cut up as shown in FIG. 22 with mark 16 still applied.

Figure 19:
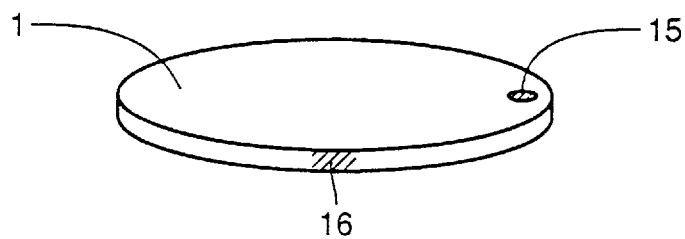
FIG. 19 is a perspective view of a completed product of the semiconductor substrate according to the second embodiment shown in FIG. 16 by a first manufacturing processing thereof.
Figure 23:
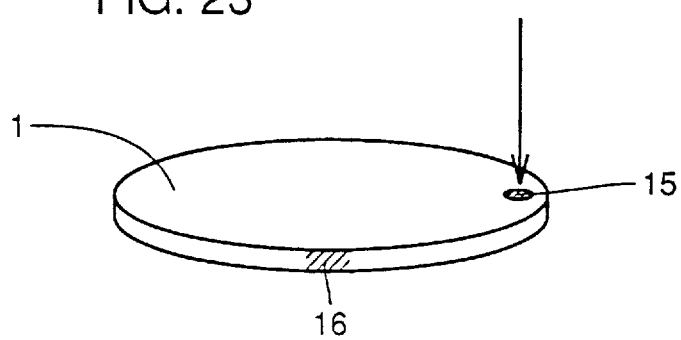

Then, as shown in FIG. 23, a mark 15 that is not erased even when subjected to a subsequent process is applied at a position indicating the crystal orientation of silicon wafer 1 on the basis of mark 16 by means of a fusion method using a laser beam, a mechanical method such as providing a cut, or a chemical method such as etching. Thus, the semiconductor substrate of the second embodiment shown in FIG. 19 is completed.

A second manufacturing process of the semiconductor substrate of the second embodiment will be described hereinafter with reference to FIGS. 24 to 28.

Figure 25:
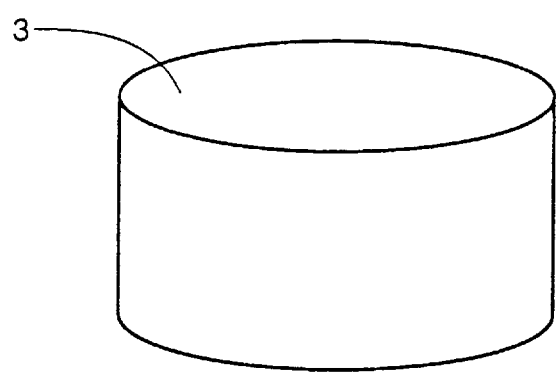
FIGS. 25–28 are perspective views of the semiconductor substrate according to the second embodiment of FIG. 16 for describing first to fourth steps of the second manufacturing process thereof.
Figure 26:
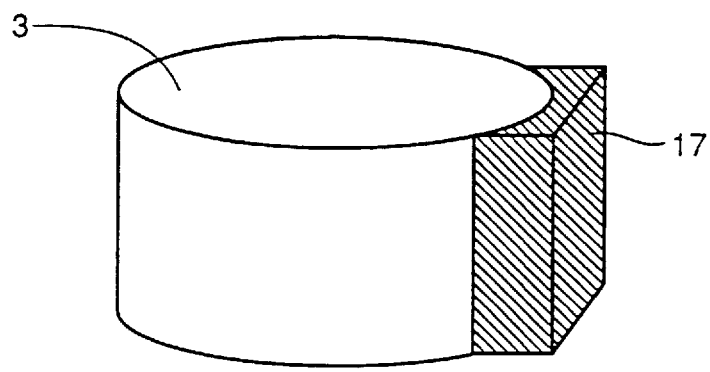

As shown in FIG. 25, a monocrystalline silicon ingot formed by a FZ method or CZ method is processed to result in cylindrical monocrystalline silicon 3. The crystal orientation of cylindrical monocrystalline silicon 3 is identified by an X-ray diffraction method. Then, as shown in FIG. 26, a slice base 7 for preventing damage of the wafer in a subsequent cutting process is attached at a position indicating the crystal orientation. Slice base 17 is formed of a structural material such as carbon or ceramic. Slice base 17 is attached to cylindrical monocrystalline silicon 3 by means of an adhesive therebetween.

Figure 24:
FIG. 24 is a perspective view of a completed product of the semiconductor substrate according to the second embodiment shown in FIG. 16 by a second manufacturing process.
Figure 27:
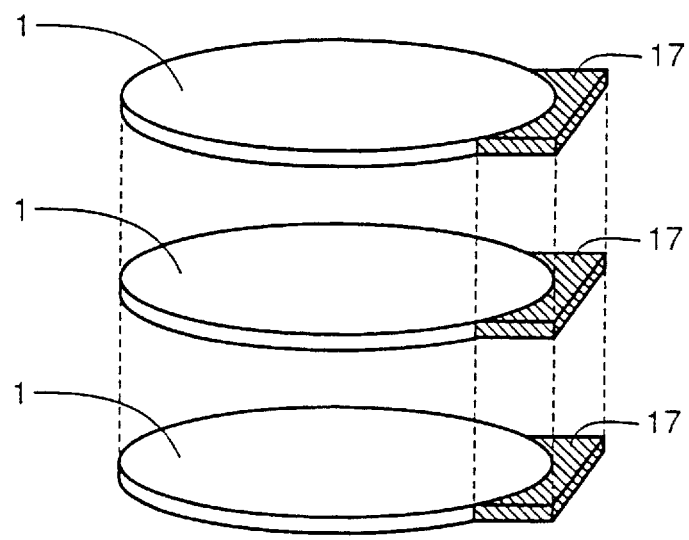
Figure 28:
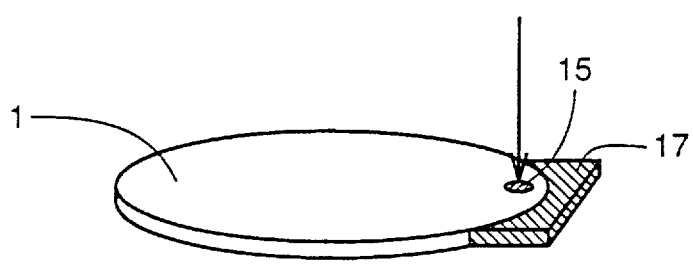

Cylindrical monocrystalline silicon 3 having slice base 17 attached is cut up into a predetermined thickness together with slice base 17 attached thereto as shown in FIG. 27. Finally, a mark 15 that is not erased even when subjected to a subsequent process is applied by a fusion method using a laser beam, a cutting mechanical method, or a chemical method such as etching at a position indicating the crystal orientation of the silicon wafer on the basis of slice base 17 cut, as shown in FIG. 28. Thus, a semiconductor substrate according to the second embodiment shown in FIG. 24 is completed.

Figure 29:
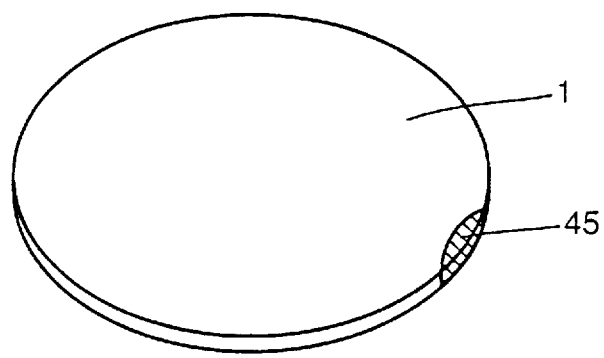
FIG. 29 is a perspective view showing a semiconductor substrate according to a third embodiment of the present invention.

FIG. 29 is a perspective view showing a semiconductor substrate according to a third embodiment of the present invention. Referring to FIG. 29, a semiconductor substrate of the third embodiment has a silicon oxide 45 for detecting the crystal orientation formed at the outer perimeter portion of silicon wafer 1. Silicon oxide 45 is formed as to be buried in silicon wafer 1. Similar to the above-described first and second embodiments, silicon wafer 1 of the third embodiment has an outer perimeter entirely of a circular contour in contrast to the conventional semiconductor substrate shown in FIGS. 73 and 79 having an orientation flat or notch. Therefore, the problems encountered in the conventional products such as reduction in the effective area and mechanical strength, non-uniformity of the resist film, and generation of foreign objects do not occur. Since atoms other than silicon and oxygen are not present in the mark portion, the third embodiment provides an advantage that contamination of the silicon wafer due to impurities does not easily occur in comparison with that of the first embodiment.

Figure 31:
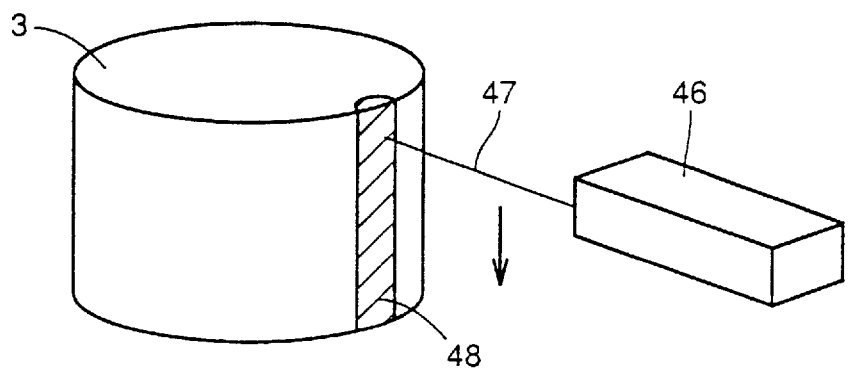
Figure 32:
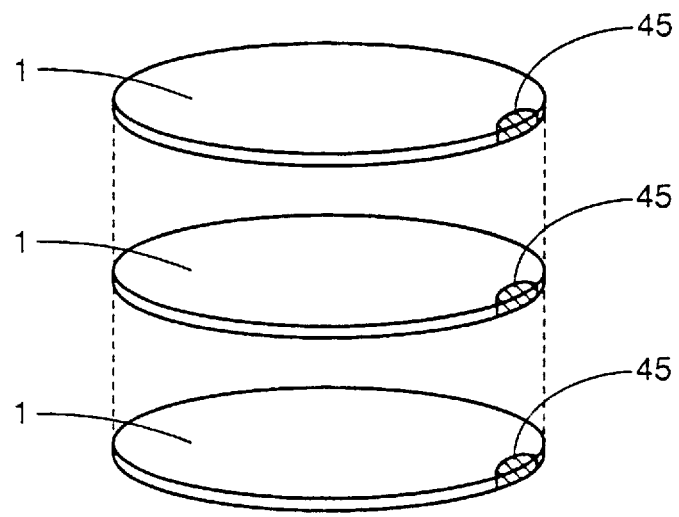

A manufacturing processing of the semiconductor substrate of the third embodiment will be described hereinafter with reference to FIGS. 30 to 32.

Figure 30:
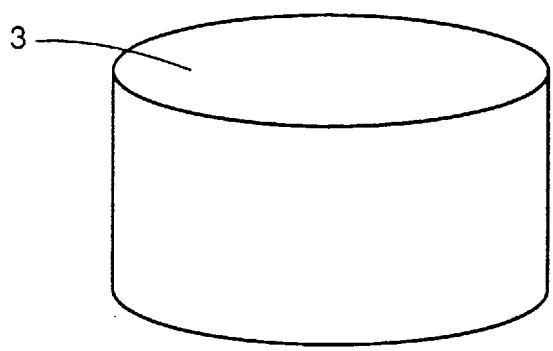
FIGS. 30–32 are perspective views of the semiconductor substrate according to the third embodiment shown in FIG. 29 for describing first to third steps of a manufacturing processing thereof.

As shown in FIG. 30, a monocrystalline silicon ingot formed by a FZ method of CZ method is processed to result in cylindrical monocrystalline silicon 3. The crystal orientation of cylindrical monocrystalline silicon is identified by an X-ray diffraction method. Then, as shown in FIG. 31, silicon oxide 48 is formed at the outer perimeter portion of the cylinder corresponding to the crystal orientation and in parallel to the cylinder axis by a scanning operation using a laser beam. Silicon oxide 48 is formed so as to be buried in cylindrical monocrystalline silicon 3. Cylindrical monocrystalline silicon 3 having silicon oxide 48 formed therein is cut up as shown in FIG. 32. Thus, the semiconductor substrate of the third embodiment shown in FIG. 29 is completed.

Figure 33:
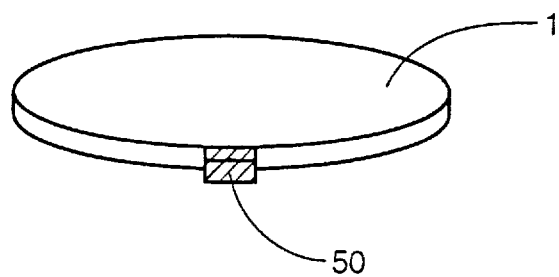
FIG. 33 is a perspective view showing a semiconductor substrate according to a fourth embodiment of the present invention.

FIG. 33 is a perspective view showing a semiconductor substrate according to a fourth embodiment of the present invention. Referring to FIG. 33, the semiconductor substrate of the fourth embodiment has a film 50 of nitride, polysilicon, or metal silicide formed on the side surface of the outer perimeter portion of silicon wafer 1 for detecting the crystal orientation. Film 50 is formed as to closely adhere to the side surface of the outer perimeter of silicon wafer 1. Similar to the above-described embodiments, silicon wafer 1 of the fourth embodiment has an outer perimeter entirely of a circular contour in contrast to the conventional semiconductor substrate shown in FIGS. 73 and 79 having an orientation flat or notch. Therefore, problem encountered in conventional products such as reduction in the effective area and mechanical strength, non-uniformity of the resist film, and generation of foreign objects do not occur.

Figure 35:
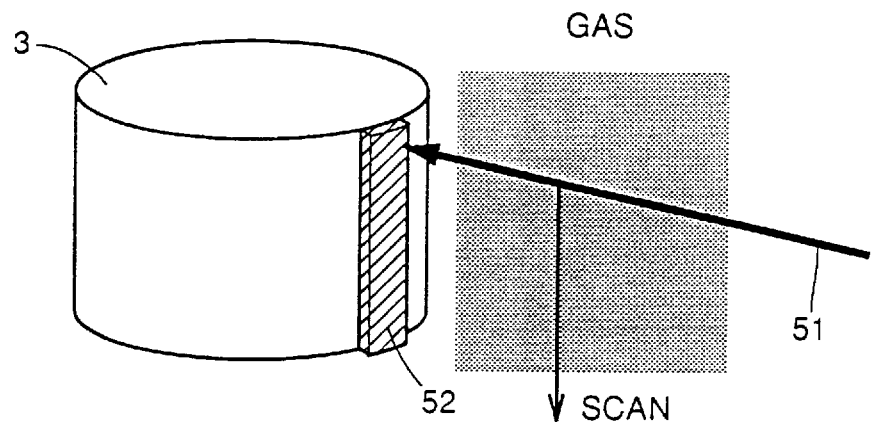
Figure 36:
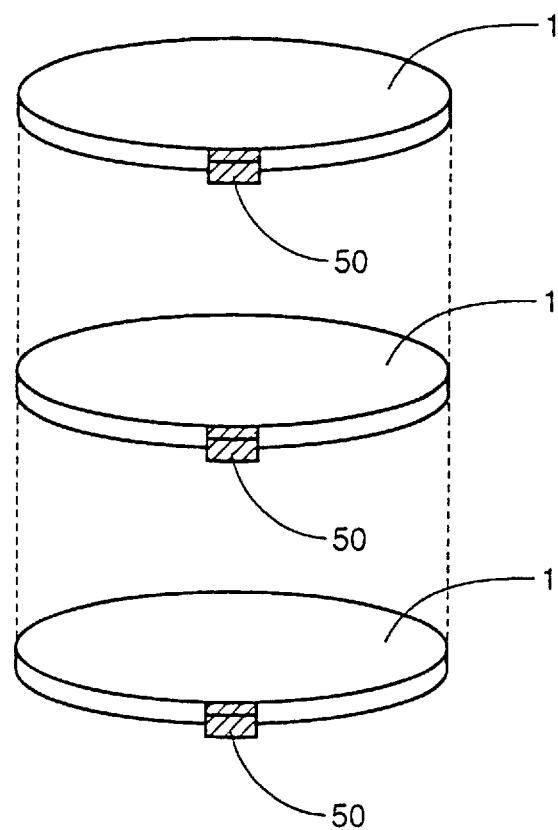

A manufacturing process of the semiconductor substrate of the fourth embodiment will be described hereinafter with reference to FIGS. 34 to 36.

Figure 34:
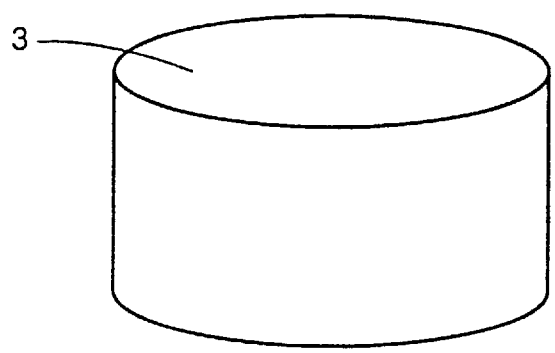
FIGS. 34–36 are perspective views of the semiconductor substrate according to the fourth embodiment shown in FIG. 33 for describing first to third steps of the manufacturing process thereof.

As shown in FIG. 34, a monocrystalline silicon ingot formed by a FZ or CZ method is processed to result in cylindrical monocrystalline silicon 3. The crystal orientation of cylindrical monocrystalline silicon 3 is identified by an X-ray diffraction method. Then, the side surface of the outer perimeter of the cylinder corresponding to the crystal orientation is scanned with light in parallel to the cylinder axis, whereby a film 52 such as a nitride film, a polysilicon film, or a metal type silicide film is formed by photo CVD. Details of photo CVD is described in Appl. Phys. Lett. 43(8), 15 Oct. 1983, pp. 774~776. Cylindrical monocrystalline silicon 3 with film 52 is cut up as shown in FIG. 36. Thus, a semiconductor substrate according to the fourth embodiment as shown in FIG. 33 is completed.

Figure 37:
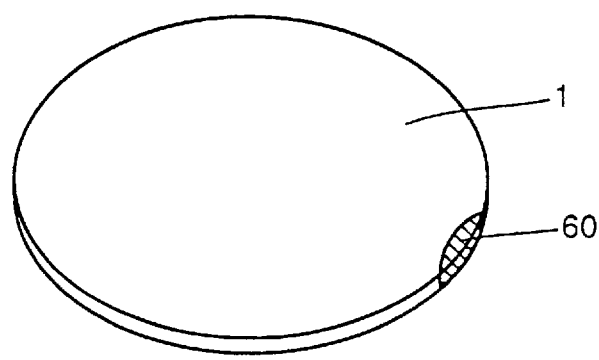
FIG. 37 is a perspective view showing a semiconductor substrate according to a fifth embodiment of the present invention.

FIG. 37 is a perspective view showing a semiconductor substrate according to a fifth embodiment of the present invention. Referring to FIG. 37, a semiconductor substrate of the fifth embodiment has a magnetic substance region 60 formed at the outer perimeter portion of silicon wafer 1 to detect the crystal orientation. Magnetic substance region 60 is formed so as to be buried in silicon wafer 1. Magnetic substance region 60 is formed of Co, Ni or Ti, for example. Similar to the above-described first embodiment, the fifth embodiment has a complete circular outer perimeter of silicon wafer 1 in contrast to the conventional semiconductor substrate shown in FIGS. 73 and 79 having an orientation flat or notch. Therefore, problems encountered in conventional products such as reduction in the effective area and mechanical strength, non-uniformity of the resist film, and generation of a foreign objects do not occur. Furthermore, the fifth embodiment provides a particular advantage that detection of the mark can easily be carried out magnetically with no physical contact since a magnetic substance is used as the marker.

A manufacturing process of the semiconductor substrate of the fifth embodiment will be described hereinafter with reference to FIGS. 38–41.

Figure 38:
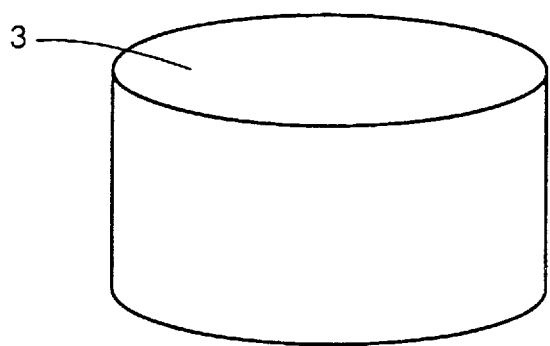
FIGS. 38–41 are perspective views of the semiconductor substrate according to the fifth embodiment shown in FIG. 37 for describing first to fourth steps of the manufacturing process thereof.
Figure 39:
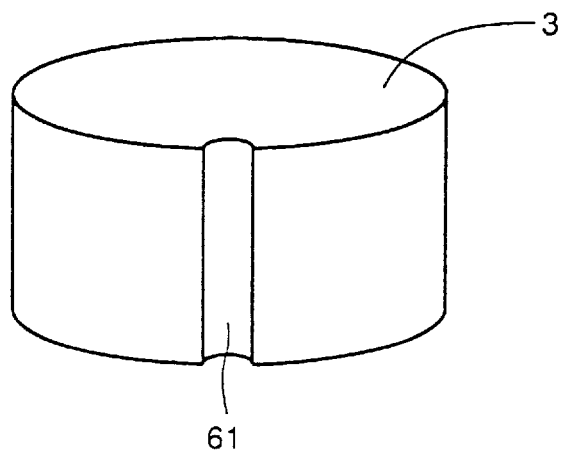
Figure 40:
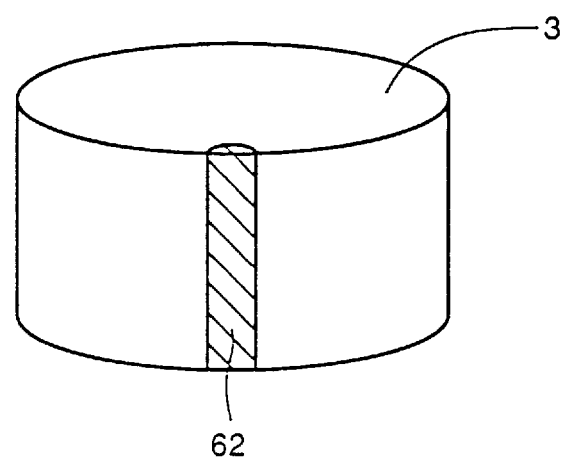
Figure 41:
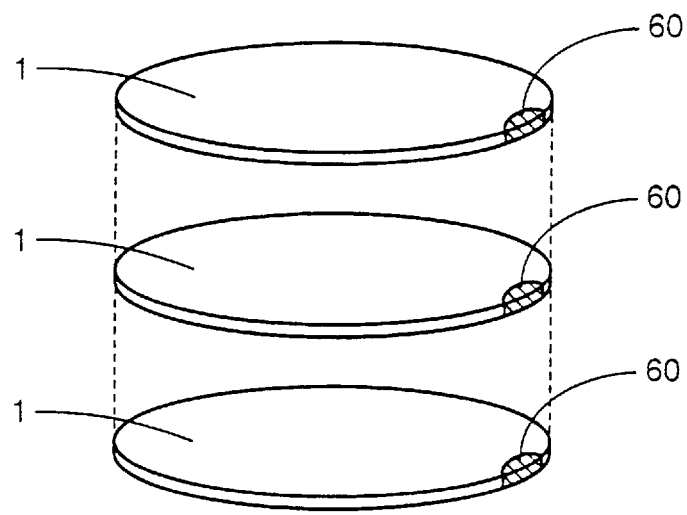

As shown in FIG. 38, a monocrystalline silicon ingot formed by a FZ method or CZ method is processed to result in cylindrical monocrystalline silicon 3. The crystal orientation of cylindrical monocrystalline 3 is identified by an X-ray diffraction method. Then, a groove 61 is formed in parallel to the cylinder axis at an outer perimeter portion of the cylinder corresponding to the crystal orientation as shown in FIG. 39. As shown in FIG. 40, a magnetic substance 62 is deposited on groove 61. Cylindrical monocrystalline silicon 3 having a magnetic substance filled in groove 61 is cut up as shown in FIG. 41. Thus, a semiconductor substrate of the fifth embodiment shown in FIG. 37 is completed.

Figure 42:
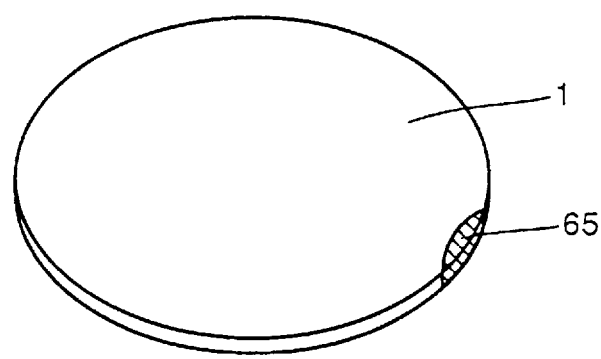
FIG. 42 is a perspective view showing a semiconductor substrate according to a sixth embodiment of the present invention.

FIG. 42 is a perspective view showing a semiconductor substrate according to a sixth embodiment of the present invention. Referring to FIG. 42, a semiconductor substrate of the sixth embodiment has a magnetic substance region 65 formed at an outer perimeter portion of silicon wafer 1 to detect the crystal orientation. Magnetic substance region 65 is formed so as to be buried in silicon wafer 1. Magnetic substance region 65 is formed of, Cr, Ni, or Ti, for example. Similar to the above-described first embodiment, the sixth embodiment has a complete circular outer perimeter of silicon wafer 1 in contrast to the conventional semiconductor substrate shown in FIGS. 73 and 79 having an orientation flat or notch. Therefore, problems encountered in conventional products such as reduction in the effective area and mechanical strength, non-uniformity of the resist film, and generation of a foreign objects do not occur. Furthermore, the sixth embodiment provides the particular advantage that the mark can be detected magnetically in ease with no physical contact since the mark is formed of a magnetic substance.

Figure 44:
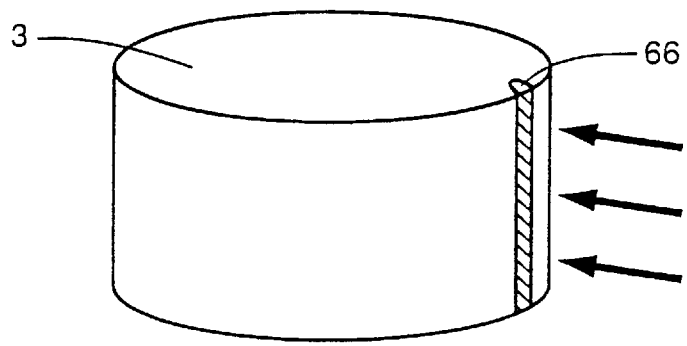
Figure 45:
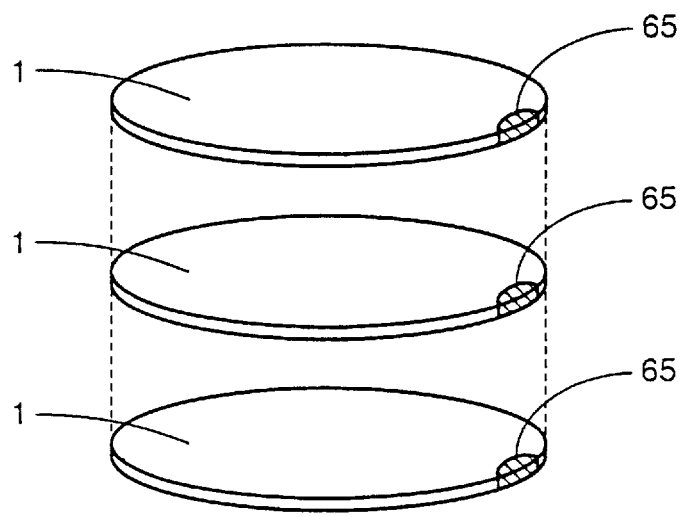

A manufacturing process of the semiconductor substrate according to the sixth embodiment will be described hereinafter with reference to FIGS. 43 to 45.

Figure 43:
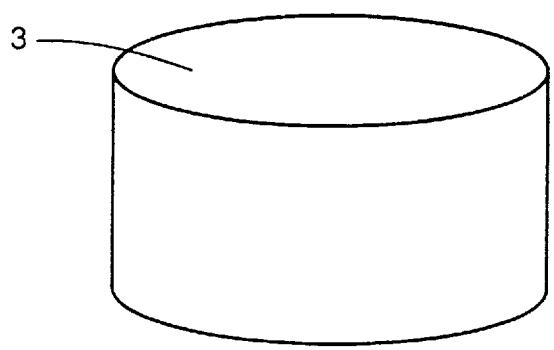
FIGS. 43–45 are perspective views of the semiconductor substrate according to the sixth embodiment shown in FIG. 42 for describing first to third steps of the manufacturing process thereof.

As shown in FIG. 43, a monocrystalline silicon ingot formed by a FZ method or CZ method is processed to result in cylindrical monocrystalline silicon 3. The crystal orientation of cylindrical monocrystalline silicon 3 is identified by an X-ray diffraction method. Then, a magnetic substance 66 is implanted parallel to the cylinder axis at the outer perimeter portion of the cylinder corresponding to the crystal orientation as shown in FIG. 44. Then, cylindrical monocrystalline silicon 3 is cut off as shown in FIG. 45. Thus, the semiconductor substrate of the sixth embodiment shown in FIG. 42 is completed.

Figure 46:
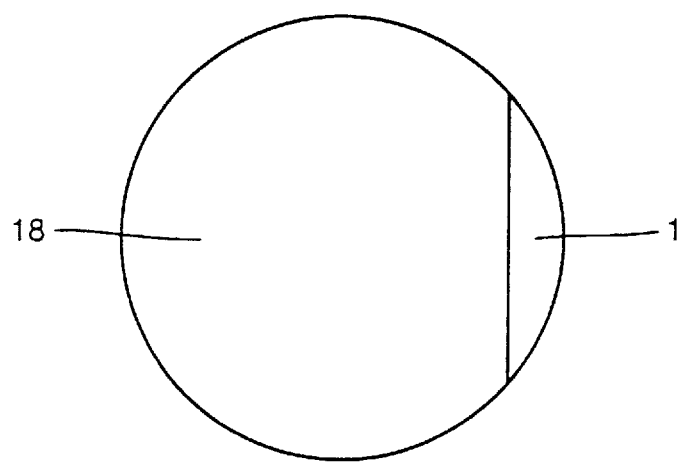
FIG. 46 is a plan view showing a semiconductor substrate according to a seventh embodiment of the present invention.
Figure 47:
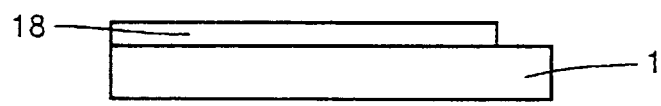
FIG. 47 is a side view showing the semiconductor substrate according to the seventh embodiment of the present invention.

Referring to FIGS. 46 and 47, a semiconductor substrate according to a seventh embodiment has a first silicon wafer 1 of a complete circular outer perimeter and a second silicon wafer 18 with an orientation flat bonded together. As a result, second silicon wafer 18 with an orientation flat is reinforced by first silicon wafer 1 of a circular shape. Thus, the mechanical strength can be improved in comparison with the semiconductor substrate having an orientation flat as shown in FIG. 73.

A manufacturing process of the semiconductor substrate of the seventh embodiment will be described hereinafter with reference to FIGS. 48 to 51.

Figure 48:
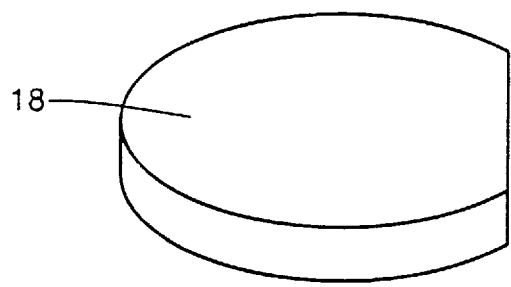
FIG. 48 is a perspective view showing a second silicon wafer according to the seventh embodiment shown in FIGS. 46 and 47.
Figure 49:
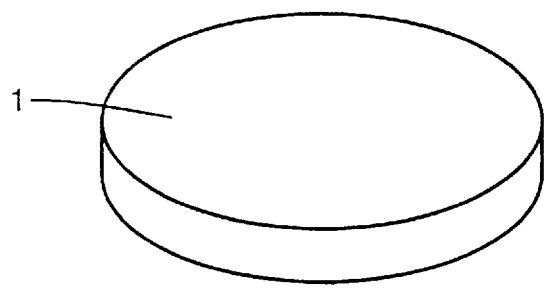
FIG. 49 is a perspective view showing a first silicon wafer according to the seventh embodiment shown in FIGS. 46 and 47.

A second silicon wafer having an orientation flat as shown in FIG. 48, and a first silicon wafer 1 having an outer perimeter entirely of a circular contour as shown in FIG. 49 are formed individually. The orientation flat of second silicon wafer 18 shown in FIG. 48 is formed at a predetermined position for indicating the crystal orientation identified by an X-ray diffraction method.

Figure 50:
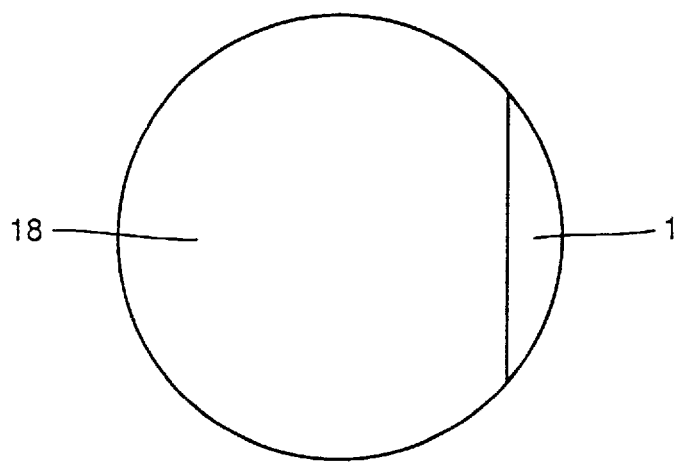
FIG. 50 is a plan view showing the first and second wafers of FIGS. 46 and 47 bonded together.
Figure 51:
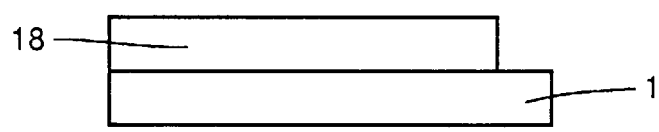
FIG. 51 is a side view showing the first and second silicon wafers bonded together of FIGS. 46 and 47.

By bonding first and second silicon wafers 18 and 1 together, a semiconductor substrate of a structure shown in FIGS. 50 and 51 is obtained. Then, second silicon wafer 18 is processed to have a predetermined thickness, and the semiconductor substrate of the seventh embodiment shown in FIGS. 46 and 47 is completed.

Figure 52:
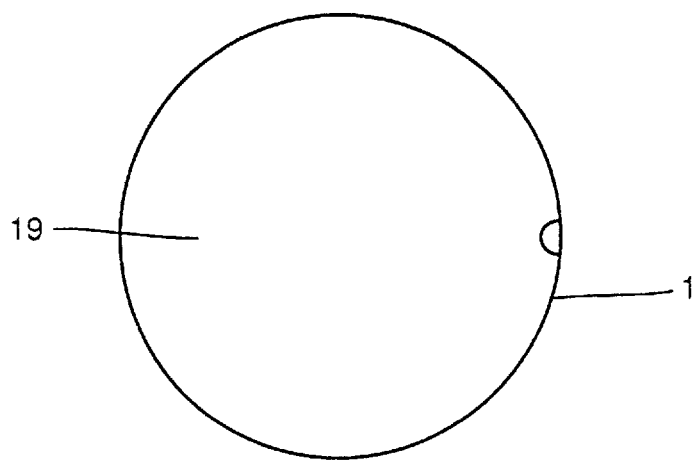
FIG. 52 is a plan view showing a semiconductor substrate according to an eighth embodiment of the present invention.
Figure 53:
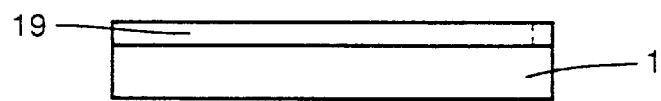
FIG. 53 is a side view showing the semiconductor substrate according to the eighth embodiment of the present invention.

Referring to FIGS. 52 and 53, a semiconductor substrate of an eighth embodiment has a first silicon wafer 1 of a complete circular outer perimeter and a second silicon wafer 19 with a notch bonded together. By reinforcing second silicon wafer 19 including a notch of low mechanical strength by first silicon wafer 1 of a complete circular contour in the semiconductor substrate of the present eighth embodiment, the mechanical strength can be improved in comparison with that of the conventional semiconductor substrate shown in FIGS. 73 and 79 having an orientation flat or notch.

A manufacturing method of the semiconductor substrate of the eighth embodiment will be described hereinafter with reference to the figures of 54 to 54.

Figure 54:
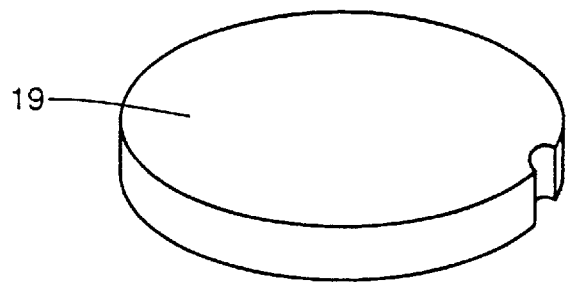
FIG. 54 is a perspective view showing a second silicon wafer according to the eighth embodiment shown in FIGS. 52 and 53.
Figure 55:
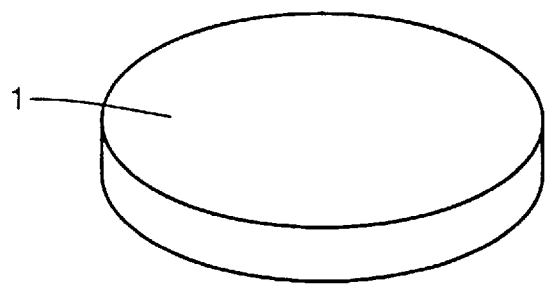
FIG. 55 is a perspective view showing a first silicon wafer according to the eighth embodiment of FIGS. 52 and 53.
Figure 56:
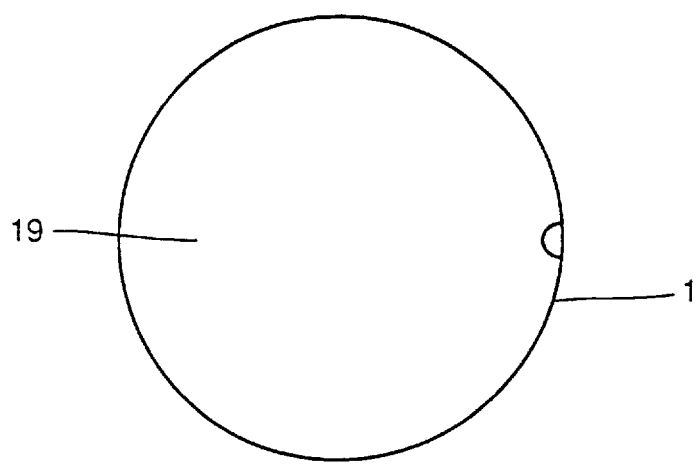
FIG. 56 is a plan showing the first and second silicon wafers bonded together of FIGS. 52 and 53.
Figure 57:
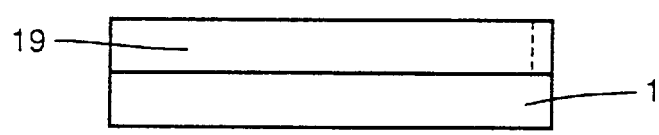
FIG. 57 is a side view showing the first and second silicon wafers of FIGS. 52 and 53 bonded together.

Second silicon wafer 19 with a notch as shown in FIG. 54 and first silicon wafer 1 with a complete circular outer perimeter as shown in FIG. 55 are formed individually. The notch of second silicon wafer 19 shown in FIG. 54 is provided at a predetermined position on the basis of identification of the crystal orientation by an X-ray diffraction method. By bonding first and second silicon wafers 19 and 1 together, the semiconductor substrate of the structure shown in FIGS. 56 and 57 is obtained. Then, second silicon wafer 19 is processed to have a predetermined thickness, whereby the semiconductor substrate of the eighth embodiment shown in FIGS. 52 and 53 is completed.

Figure 58:
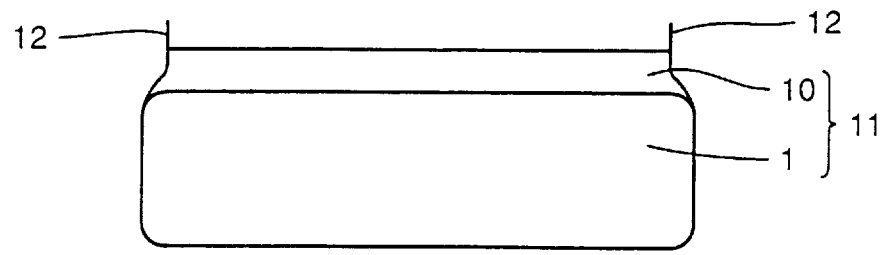
FIG. 58 is a side view showing a silicon substrate having a n epitaxial-grown layer employed in the method of using a semiconductor substrate according to a ninth embodiment of the present invention.
Figure 59:
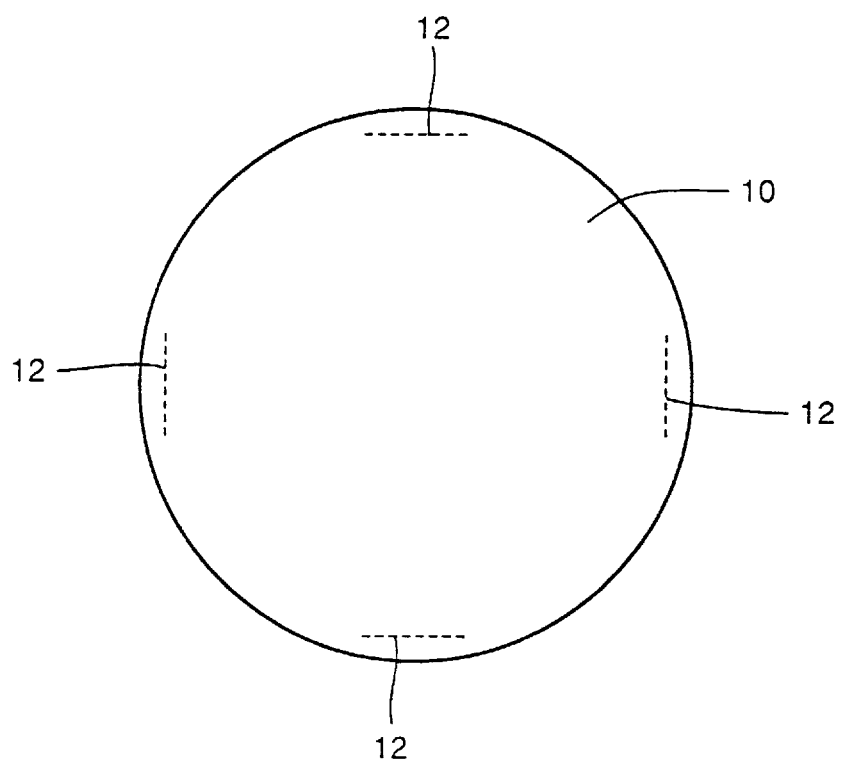
FIG. 59 is a plan view showing a silicon substrate having an epitaxial-grown layer employed in a method of using the semiconductor substrate according to the ninth embodiment of the present invention.

A method of using a semiconductor substrate according to a ninth embodiment of the present invention will be described hereinafter with reference to FIGS. 58 to 61. FIGS. 58 and 59 are a side view and plan view of an epitaxially grown silicon substrate. An epitaxially grown layer 10 is formed on a surface of silicon substrate 1. An epitaxially grown substrate 11 is formed of epitaxially grown layer 10 and silicon substrate 1. By growing silicon epitaxially on silicon substrate 1, a step portion 12 perpendicular to the main surface of silicon substrate 1 is formed in a direction parallel to the crystal plane of (110).

Figure 60:
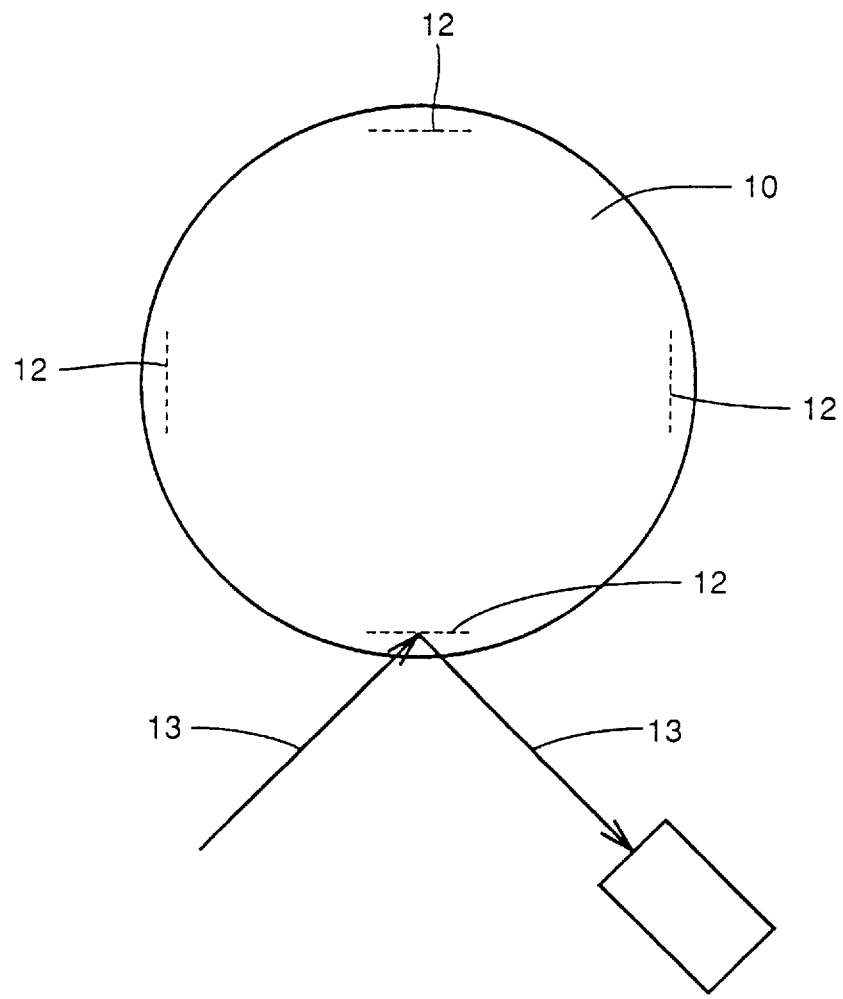
FIG. 60 is a concept diagram for describing the method of identifying the crystal orientation by a laser beam according to the ninth embodiment of the present invention.

Since step portion 12 is formed in a direction with a constant relationship to the crystal orientation, detection of the direction of step portion 12 results in identification of a crystal orientation. More specifically, as shown in FIG. 60, light to be reflected by step portion 12, for example, a laser beam 13 is applied to step portion 12.

Figure 61:
FIG. 61 is a perspective view showing a step in a case where a mark indicating the crystal orientation is applied on the surface of the substrate in the ninth embodiment.

The direction of step portion 12 can be identified by detecting the direction of the reflected laser beam 13. Therefore, the crystal orientation can be identified. After identification of the crystal orientation, the epitaxially grown layer 10 may be used, or a mark 15 may be applied as shown in FIG. 61 to a particular position indicating the crystal orientation at the main surface of epitaxially grown layer 10 to facilitate identification of the crystal orientation at a subsequent step.

Figure 62:
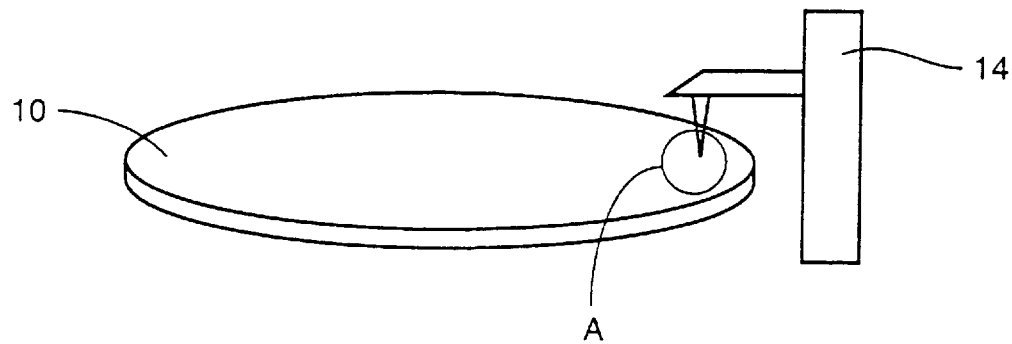
FIG. 62 is a concept diagram for describing a method of identifying the crystal orientation of an epitaxially grown silicon substrate according to a tenth embodiment of the present invention by a microscope.
Figure 63:
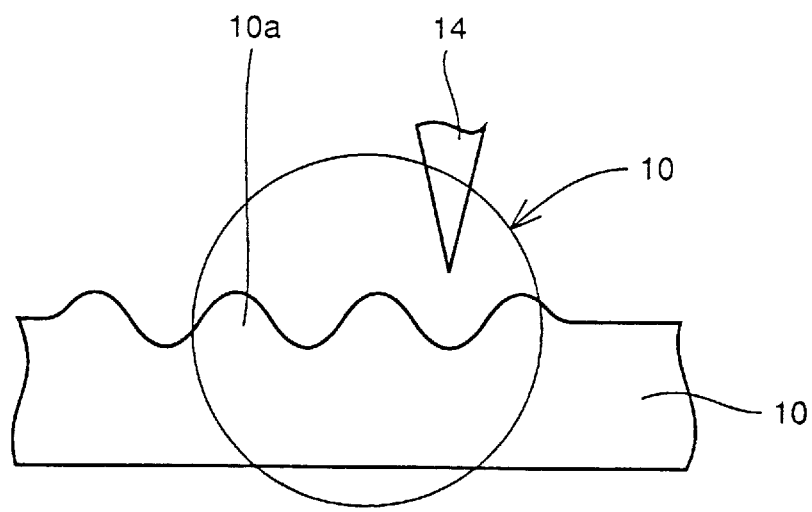
FIG. 63 is an enlarged sectional view of region A shown in FIG. 62.
Figure 64:
FIG. 64 is a perspective view showing the state of applying a mark indicating crystal orientation at the surface of the substrate according to the tenth embodiment.

A method of using a semiconductor substrate according to a tenth embodiment will be described hereinafter with reference to FIGS. 62 to 64. FIG. 62 is a concept diagram for describing a method of identifying the crystal orientation of an epitaxially grown silicon substrate. An enlargement of the detection portion A of FIG. 62 is shown in FIG. 63. As shown in FIG. 63, the surface of epitaxially grown silicon substrate 10 is formed in an orderly concave and convex manner specific to the crystal orientation, generally termed "step-and-terrace". By detecting the direction of the concave and convex with a probe scan type microscope (for example, an atomic force microscope) 14, the crystal orientation of epitaxially grown silicon substrate 10 can be identified. The epitaxially grown silicon substrate 10 may be used after identification of the crystal orientation, or a mark 15 may be applied at a particular position indicating the crystal orientation of the surface of silicon substrate 10 as shown in FIG. 64 to facilitate identification of the crystal orientation in a subsequent step.

Figure 65:
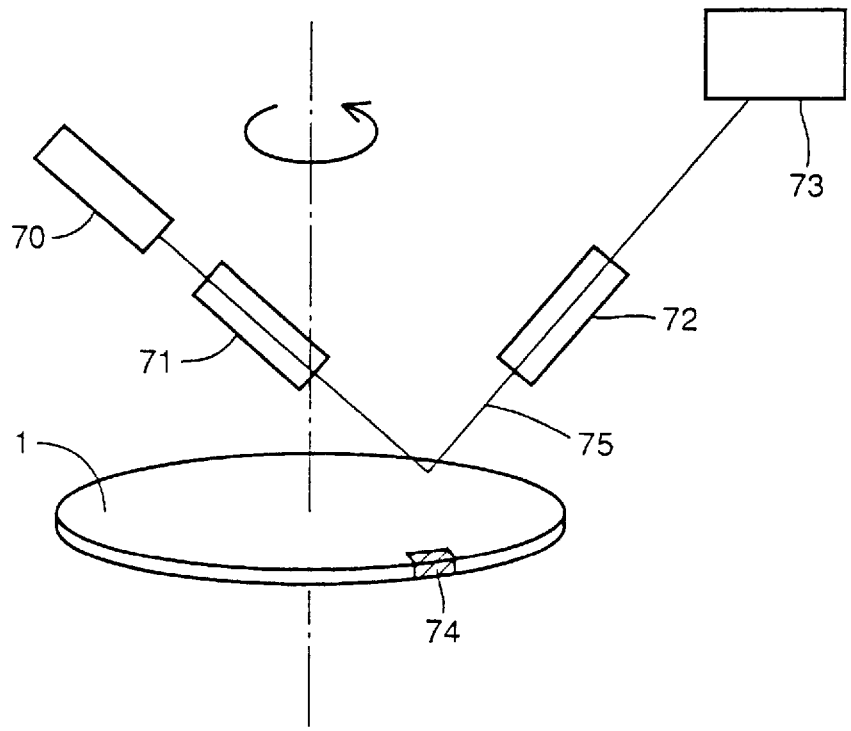
FIG. 65 is a concept diagram for describing a method of identifying the crystal orientation according to light reflection in an eleventh embodiment of the present invention.

Referring to FIG. 65, a method of using a semiconductor substrate according to an eleventh embodiment will be described. In the semiconductor substrate of the eleventh embodiment, an oxide film 74 is formed at the outer perimeter portion of silicon wafer 1 to detect the crystal orientation. Light from a device 70 that emits elliptically polarized light in an angle of incidence, for example a He-Ne laser radiation device, is emitted to a predetermined region on silicon wafer 1 in a constant direction through an optical filter 71. The reflected light which is plane polarized light passes through an optical filter 72 to be detected by a detector amplifier 73, for example, by high sensitive photodiodes. The detected light reflected by an oxide region 74 of silicon wafer 1 has an index of refraction different from that when reflected by a region other than the oxide region. By detecting this difference in index of refraction using polarization analysis while rotating silicon wafer 1 about the axis at the center of the main surface thereof, the position of oxide film 74 can be detected to identify the crystal orientation.

Therefore, the crystal orientation of silicon wafer 1 can be identified as described above.

Alternatively, light intensity may be detected by detection amplifier 73. In this case, the difference in the reflectance of light in oxide region 74 and other regions is taken advantage of. Mark 74 for detecting the crystal orientation mark 74 is applicable to the present method as long as the index of refraction or the light reflectance differ from those of silicon wafer 1. It may be formed of nitride, metal silicide, or the like, and is not limited to the above-described oxide.

Figure 66:
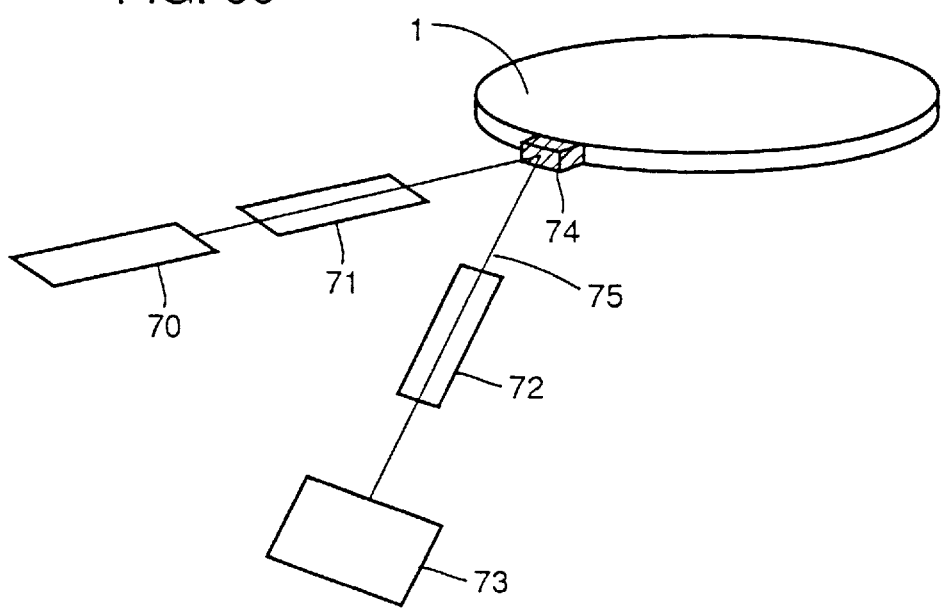
FIG. 66 is a concept diagram for describing a modification of a method of identifying the crystal orientation according to light reflection in the eleventh embodiment of the present invention.

When detection mark 74 is formed at the side portion of silicon wafer 1, the present method is applicable by directing light from the side direction of the silicon wafer as shown in FIG. 66. Each component in FIG. 66 is similar to that shown in FIG. 65, and those allotted with like numerals of FIG. 65 have the same function.

Figure 67:
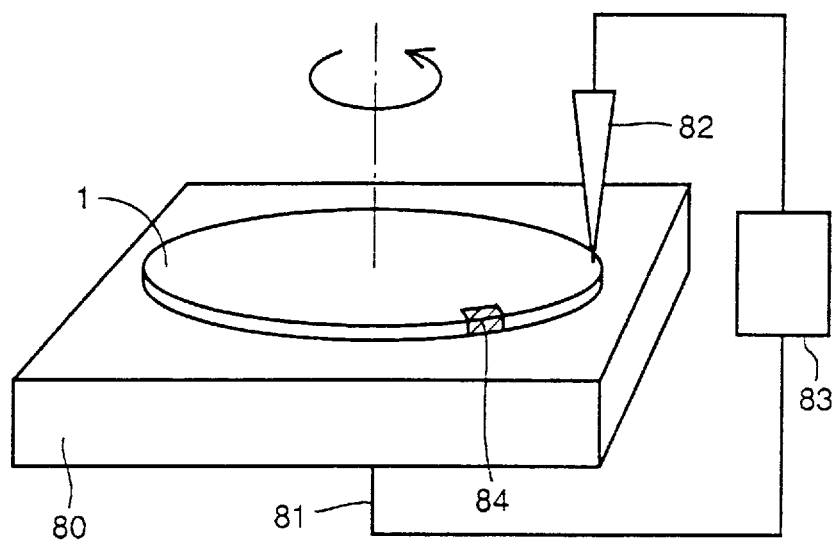
FIG. 67 is a concept diagram for describing a method of identifying the crystal orientation according to change in electrical resistance of a twelfth embodiment of the present invention.

FIG. 67 is a concept diagram for describing a method of using a semiconductor substrate according to a twelfth embodiment of the present invention. Referring to FIG. 67, a method of using a semiconductor substrate according to a twelfth embodiment will be described. The semiconductor substrate of the twelfth embodiment has an oxide region 84 formed at the outer perimeter portion of silicon wafer 1 to detect the crystal orientation. Silicon wafer 1 is mounted on a base 80 as shown in FIG. 67. Base 80 functions so as to electrically connect silicon wafer 1 with one electrode 81. The other electrode 82 is brought into contact with a predetermined region at the periphery of silicon wafer 1. Accordingly, the electrical resistance of silicon wafer 1 can be measured by electrical resistance measurement device 83. Silicon wafer 1 is rotated with the center of the main surface as the axis to measure the electrical resistance of the peripheral portion of the silicon wafer. When oxide region 8 is brought into contact with the electrode, the measurement value of the electrical resistance increases significantly since oxide is an insulator. More specifically, the electrical resistance is approximately several ten $\Omega \cdot cm$ in a silicon substrate, whereas the value is infinite in an oxide. The position of the oxide region can easily be identified by detecting a change in the measured value of the electrical resistance. Accordingly, the crystal orientation of the silicon wafer can be identified.

Any region for detecting the crystal orientation which is formed at the outer perimeter portion of the silicon wafer may be used as long as it has an electrical resistance different from that of the silicon wafer. For example, the present method is applicable using a region of nitride, polysilicon, silicide or the like. In these cases, the electrical resistance of a nitride film, for example, is infinite similar to an oxide film. In the case of polysilicon, an electrical resistance sufficiently different from that of the silicon substrate considering ease of detection, for example less than $1/100$ or more than 100 times the electrical resistance of the silicon substrate is set by selecting the doping condition (impurity implantation condition). In the case of silicide, the electrical resistance is not more than 0.01 $\Omega \cdot cm$. Thus, even when a nitride film is used, it has an electrical resistance sufficiently different from the several ten $\Omega \cdot cm$ of the silicon substrate. Similar to the above-described oxide, the position of the film can be detected to identify the crystal orientation of the silicon wafer.

Figure 68:
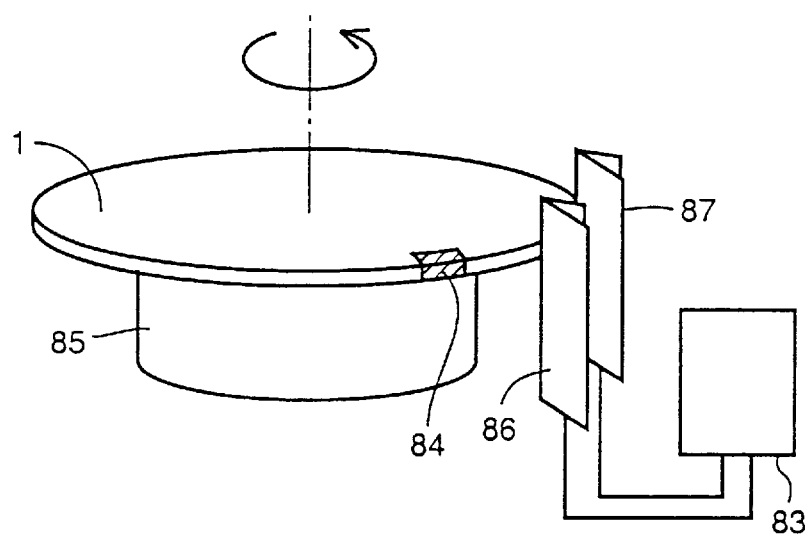
FIG. 68 is a concept diagram for describing a modification of the method of identifying the crystal orientation according to change in electrical resistance of the twelfth embodiment of the present invention.

Similar to the previous embodiment, the location of a region such as of oxide or the like can be detected by disposing electrodes as shown in FIG. 68 to measure the electrical resistance between two points at the outer perimeter portion of the silicon wafer.

Figure 69:
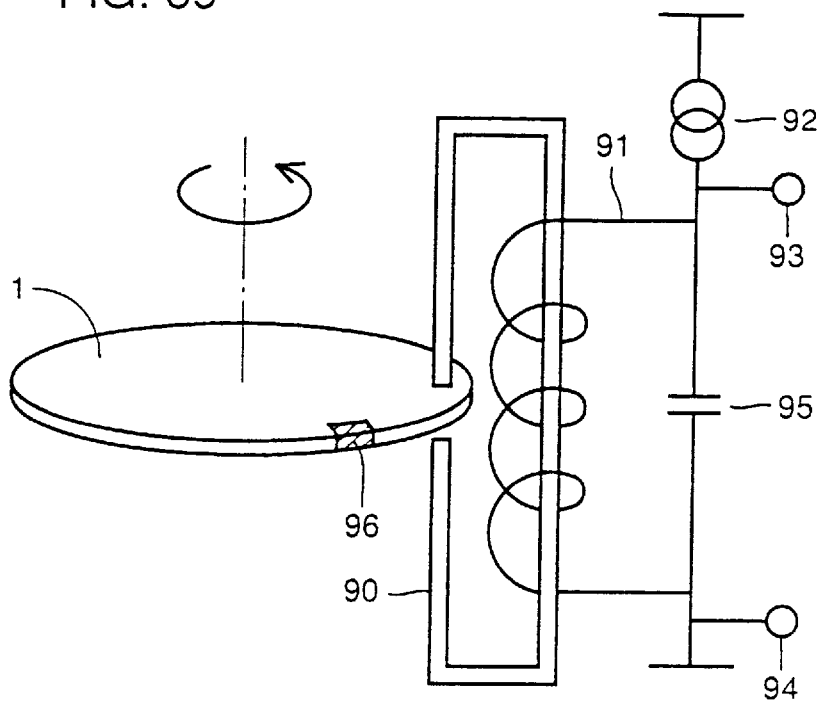
FIG. 69 is a concept diagram for describing a method of identifying the crystal orientation according to change in the absorbed amount of high-frequency power of a thirteenth embodiment of the present invention.

FIG. 69 is a concept diagram for describing a method of using a semiconductor substrate according to a thirteenth embodiment of the present invention. Referring to FIG. 69, a method of using a semiconductor substrate of the thirteenth embodiment will be described. A semiconductor substrate of the thirteenth embodiment has a mark 96 formed at the outer perimeter of silicon wafer 1 to detect the crystal orientation. Any mark 96 that has a conductivity different from that of silicon wafer, for example, oxide, nitride, metal silicide or the like may be used.

This detection device has a coil 91 wound around a ferrite 90. A capacitance element 95 is disposed between terminals 93 and 94. High frequency is generated by a high frequency constant current source 92. The device is arranged at a peripheral region of silicon wafer without contact of ferrite 90. Under this state, eddy current is generated at the periphery of silicon wafer 1 by inductive coupling.

More specifically, eddy current is generated within silicon wafer 1 by inductive coupling with a high frequency circuit. The generated eddy current is lost as Joule heat. By taking advantage that the absorption by the eddy current (Joule heat) in silicon wafer 1 of high-frequency power and the conductivity take a positive correlation, the difference in the conductivity between silicon wafer 1 and mark 96 can be detected with no physical contact.

The voltage across terminals 93 and 94 is measured while rotating silicon wafer 1 with the center of the main surface as the axis. Since the conductivity of mark portion 96 differs from that of the other portion, the measured voltage changes when mark 96 arrives at the ferrite 90 portion. The position of mark 96 can be located by detecting this change, whereby the crystal orientation of silicon wafer 1 is identified.

Figure 70:
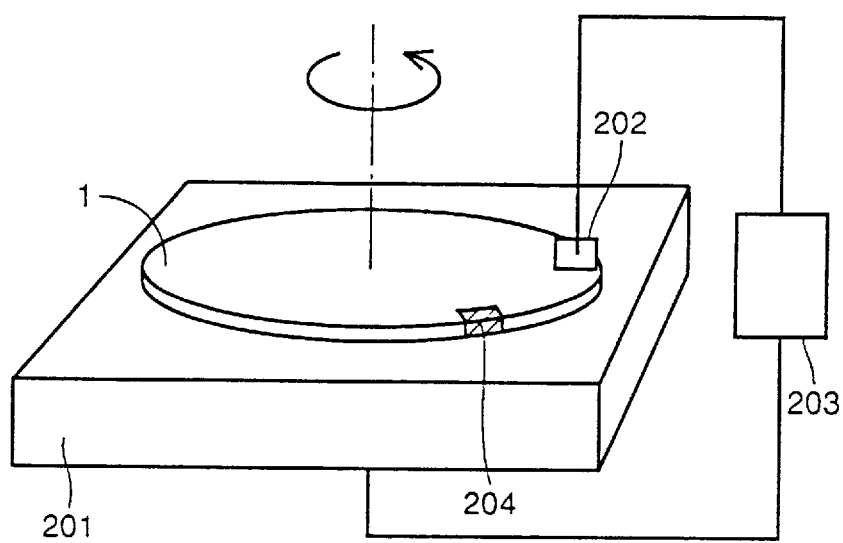
FIG. 70 is a concept diagram for describing a method of identifying the crystal orientation according to change in dielectric constant of a fourteenth embodiment of the present invention.

FIG. 70 is a concept diagram for describing a method of using a semiconductor substrate according to a fourteenth embodiment of the present invention. Referring to FIG. 70, a method of using the semiconductor substrate of the fourteenth embodiment will be described. The semiconductor substrate of the fourteenth embodiment has oxide region 904 formed at the outer perimeter portion of silicon wafer 1 to detect the crystal orientation. As shown in FIG. 70, silicon wafer 1 is mounted on a base 201. Base 201 electrically connects silicon wafer 1 with one electrode of an electrostatic capacity measurement device. Electrostatic capacity measurement device 203 has the other electrode electrically connected to an electrode 202 provided in parallel to the main surface of silicon wafer 1. Accordingly, the electrostatic capacity formed of silicon wafer 1 and electrode 202 can be measured. This electrical capacitance is proportional to the dielectric constant of the material present between both electrodes establishing electrostatic capacity. By rotating silicon wafer 1 with the center of the main surface thereof as the axis, a change in the electrostatic capacity can be detected since the dielectric constant of oxide film region 204 differs from that of the other region. By locating a position in silicon wafer 1 where this electrostatic capacity changes, the position of oxide film region 202 can be detected to determine the crystal orientation.

Any region formed at the outer perimeter portion of the silicon wafer to detect the crystal orientation may be used as long as it has a dielectric constant different from that of the silicon wafer. For example, a region formed of nitride may be used in the present method.

Figure 71:
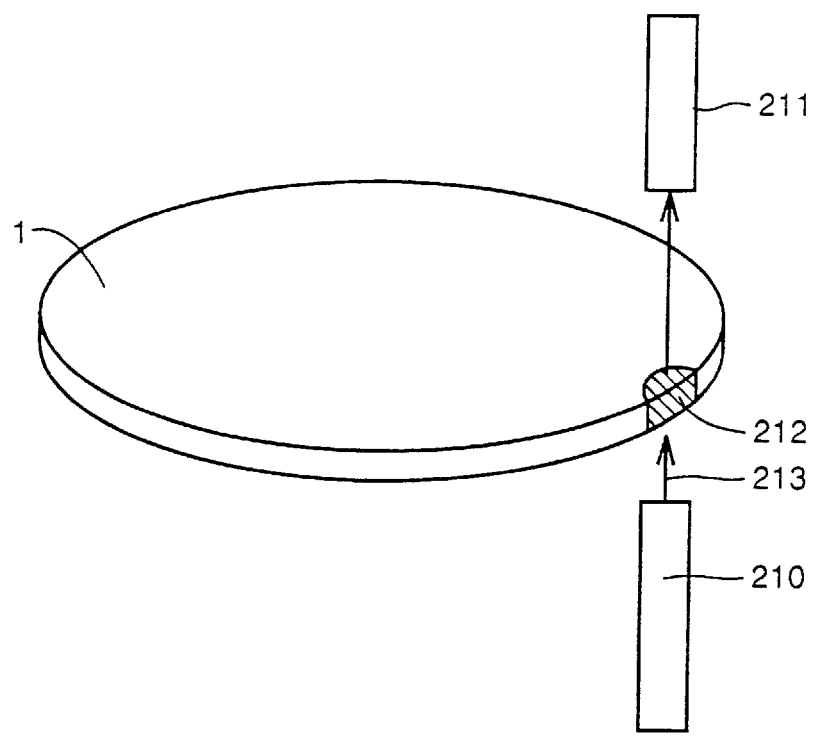
FIG. 71 is a concept diagram for describing a method of identifying the crystal orientation according to change in the angle of rotation of the plane of polarization of transmitted light of a fifteenth embodiment of the present invention.
Figure 72:
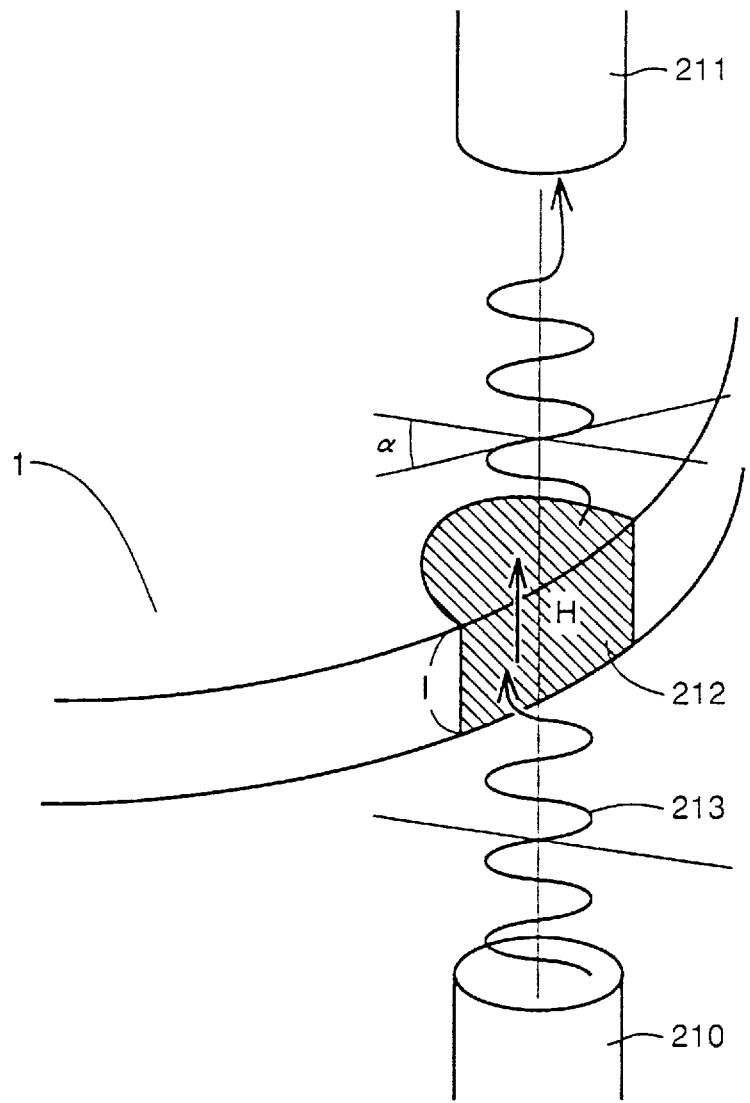
FIG. 72 is a detailed diagram of the detection portion of the concept diagram of FIG. 71.

FIG. 71 is a concept diagram for describing a method of using a semiconductor substrate according to a fifteenth embodiment of the present invention. Referring to FIG. 71, a method of using a semiconductor substrate according to the fifteenth embodiment will be described. Semiconductor substrate 1 of the fifteenth embodiment has a region 212 of a magnetic substance formed at the outer perimeter portion of silicon wafer 1 to detect the crystal orientation. Co, Ni, Ti or the like can be used for the magnetic substance. By a laser oscillator 210 emitting monochromatic linearly polarized light, monochromatic light laser 213 is directed to silicon wafer 1. The transmitted light is detected by a detector 211. This method is described in detail in FIG. 72. Referring to FIG. 72, monochromatic light laser 213 emitted by laser oscillator 210 has the plane of polarization rotated clockwise with respect to the advancing direction of light according to the material through which it passes, i.e. the level of the magnetic field of silicon wafer 1. This is called the Faraday effect. The angle of rotation α of the plane of polarization becomes the product of H and l and V when advancing l [m] in the transmitting material having a strength of H [A/m] of the magnetic field. Here, V is a proportional constant called Verdet's constant dependent upon the material. By detecting change in the angle of rotation α of the plane of polarization by detector 211, it can easily be identified whether monochromatic light laser 213 is passing through magnetic substance region 212 or another region. By detecting the position of magnetic substance region 212, the crystal orientation of silicon wafer 1 can be identified.

According to the above-described Faraday effect, the rotation of the plane of polarization of the transmitting light is detected. Similarly, the position of magnetic substance region 212 can be detected to identify the crystal polarization by detecting the rotation of the plane of polarization of the reflected light (Kerr effect).

The present invention is not limited to the above-described embodiments, and includes those in a range substantially equivalent to those of the scope of claim for patent.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor substrate comprising:
    a semiconductor wafer having an outer perimeter entirely of a circular contour, and
    a detection mark formed at a predetermined region of a surface of said semiconductor wafer for detecting the crystal orientation of said semiconductor wafer.

2. The semiconductor substrate according to claim 1, wherein said predetermined region where said detection mark is formed is located in the proximity of the outer perimeter of said semiconductor wafer.

3. The semiconductor substrate according to claim 1, wherein said detection mark comprises an impurity diffusion region.

4. The semiconductor substrate according to claim 1, wherein said detection mark comprises buried silicon including impurities.

5. The semiconductor substrate according to claim 1, wherein said detection mark comprises a mark formed of a portion of the surface of said semiconductor wafer, and having a predetermined surface configuration.

6. The semiconductor substrate according to claim 1, wherein said detection mark comprises a film formed on a side surface of the outer perimeter of said semiconductor wafer.

7. The semiconductor substrate according to claim 1, wherein said detection mark comprises silicon oxide formed so as to be buried in said semiconductor substrate.

8. The semiconductor substrate according to claim 1, wherein said detection mark comprises a magnetic substance.

9. A semiconductor substrate comprising:
    a first semiconductor wafer having an outer perimeter entirely of a circular contour, and
    a second semiconductor wafer bonded to said first semiconductor wafer, and formed in a configuration so that a predetermined region of a surface thereof can have its crystal orientation detected.

* * * * *